US007345916B2

United States Patent
Yang et al.

(10) Patent No.: US 7,345,916 B2
(45) Date of Patent: Mar. 18, 2008

(54) METHOD AND APPARATUS FOR HIGH VOLTAGE OPERATION FOR A HIGH PERFORMANCE SEMICONDUCTOR MEMORY DEVICE

(75) Inventors: Nian Yang, Mountain View, CA (US);
Boon-Aik Ang, Santa Clara, CA (US);
Yonggang Wu, Santa Clara, CA (US);
Guowei Wang, San Jose, CA (US);
Fan Wan Lai, San Jose, CA (US)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 11/423,638

(22) Filed: Jun. 12, 2006

(65) Prior Publication Data
US 2007/0291550 A1   Dec. 20, 2007

(51) Int. Cl.
*G11C 16/04*  (2006.01)
*G11C 16/06*  (2006.01)
*G11C 5/14*   (2006.01)
*G11C 7/00*   (2006.01)

(52) U.S. Cl. ............................ 365/185.14; 365/185.16; 365/185.18; 365/185.25; 365/185.28; 365/189.09; 365/203

(58) Field of Classification Search ........... 365/185.14, 365/185.18, 185.25, 185.28, 185.16, 189.09, 365/203
See application file for complete search history.

(56) References Cited

U.S. PATENT DOCUMENTS 4,263,664 A * 4/1981 Owen et al. ........... 365/185.08

(Continued)

Primary Examiner—Amir Zarabian
Assistant Examiner—Ly Duy Pham
(74) Attorney, Agent, or Firm—Ingrassia Fisher & Lorenz, P.C.

(57) ABSTRACT

A method and apparatus are provided for high performance, high voltage memory operations on selected memory cells (200) of a semiconductor memory device (100). A high voltage generator (106) during program or erase operations provides a continuous high voltage level (702) on selected word lines (502) and maintains a continuous high voltage level supply to a bit line decoder (120) which sequentially provides the high voltage level (706) to a first portion of bit lines (504) and discharges (708) those bit lines (504) before providing the high voltage level to a second portion (710).

For additional improvements to program operations, the high voltage generator (106) decouples high voltages provided to the word lines (502) and the bit lines (504) by providing a current flow control device (1208) therebetween and provides a boosting voltage at a time (1104) to overcome a voltage level drop (1102) resulting from a capacitor load associated with selected bit lines (504) and/or the bit line decoder (120) precharges (1716) a second portion of the bit lines (504) while providing a high voltage level to a first portion to program (1706) a first portion of memory cells (200).

For improvements to read operations, whether dynamic reference cells (2002) are blank is determined by providing non-identically regulated high voltage levels from a first voltage source (2112) to the dynamic reference cells (2002) and from a second voltage source (2104) to static reference cells (2004) and, if the dynamic reference cells (2002) are not blank, reads selected memory cells (200) by providing identically regulated high voltage levels to the selected memory cells (200), the dynamic reference cells (2002) and the static reference cells (2004).

12 Claims, 18 Drawing Sheets

U.S. PATENT DOCUMENTS

| | | | |
|---|---|---|---|
| 4,520,461 A * | 5/1985 | Simko | 365/185.02 |
| 5,414,669 A * | 5/1995 | Tedrow et al. | 365/226 |
| 6,950,346 B2 * | 9/2005 | You | 365/185.25 |
| 7,239,554 B2 * | 7/2007 | Jeong | 365/185.28 |
| 2005/0135147 A1 * | 6/2005 | Rinerson et al. | 365/158 |
| 2006/0164890 A1 * | 7/2006 | Lee | 365/185.28 |
| 2007/0195635 A1 * | 8/2007 | Chen et al. | 365/230.08 |

* cited by examiner

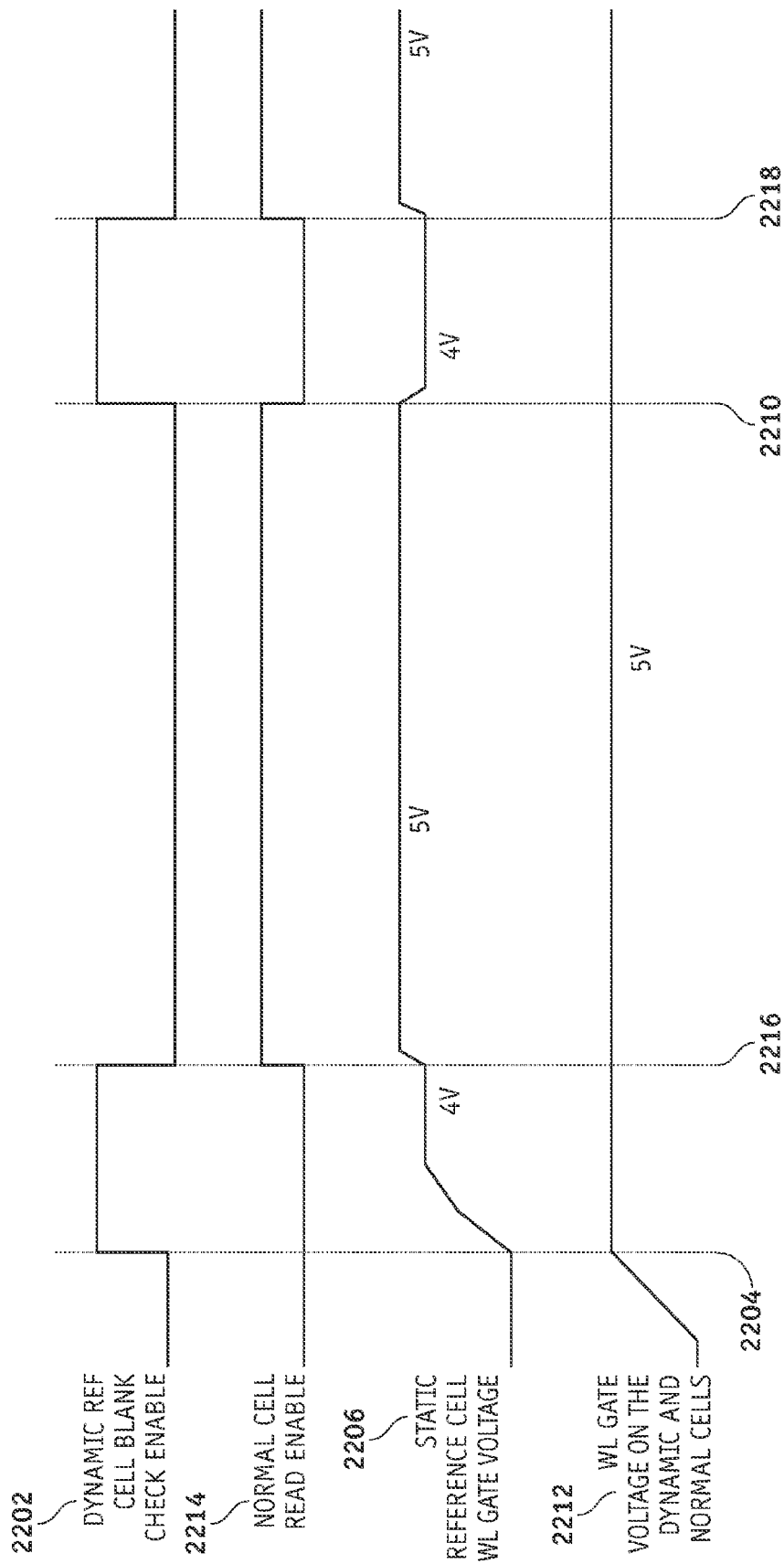

METHOD AND APPARATUS FOR HIGH VOLTAGE OPERATION FOR A HIGH PERFORMANCE SEMICONDUCTOR MEMORY DEVICE

FIELD OF THE INVENTION

The present invention generally relates to semiconductor memory devices, and more particularly relates to a method and apparatus for high voltage operation in a nonvolatile memory device.

BACKGROUND OF THE INVENTION

Semiconductor memory devices typically include a memory cell array wherein a particular memory cell is erased, programmed or read by providing appropriate voltages to word lines via an word line decoder and bit lines via a bit line decoder. In semiconductor memory devices, such as flash memory devices utilizing a single bit or multi-bit memory cell having an insulative charge trapping layer for storing information, high voltage is required to erase, program or read such information from or into the memory cell. Drain pumps and similar high voltage generating circuits are utilized to provide high voltage and/or high current for such semiconductor memory operation. For example, in such semiconductor memory devices, drain pumps are used to provide high voltage and high current for erasing data, programming (or writing) data, reading data, and verifying whether sufficient write/erase has been performed on a subject memory cell at the time of erasing or writing data. Typically, drain pumps include large capacitors. Thus, the drain pumps take time to ramp up to a targeted high voltage level. While an insulative charge trapping layer enables multi-bit per cell semiconductor memory devices as well as improves non-volatility of such memory devices, it is preferable that such memory devices improve performance by providing high speed erasing, programming and reading operations, particularly activating and deactivating bit lines for memory cell access. This is especially true of high performance semiconductor memory devices such as NAND-type memory devices or memory devices operating as NAND-type memories. Given the ramping limitations of conventional high voltage generating devices, it is difficult for many semiconductor memory devices to provide erase, program and read operations of sufficient speed to operate as NAND-type memories.

Accordingly, it is desirable to provide a method and apparatus for high speed, high voltage operation for a high performance semiconductor memory device. Furthermore, other desirable features and characteristics of the present invention will become apparent from the subsequent detailed description of the invention and the appended claims, taken in conjunction with the accompanying drawings and this background of the invention.

BRIEF SUMMARY OF THE INVENTION

A semiconductor memory device is provided which includes a memory cell array having a plurality of memory cells including selected memory cells on which high voltage operations are performed and methods for performing such high voltage operations are also provided. The semiconductor memory device further includes a plurality of word lines and a plurality of bit lines, each of the word lines and bit lines coupled to one or more of the plurality of memory cells for accessing the selected memory cells. The semiconductor device also includes a high voltage generator coupled to the word lines and the bit lines for generating and controlling the provision of a high voltage level to them.

In accordance with one aspect of the present invention, the high voltage generator provides a continuous high voltage level on selected word lines to the selected memory cells and maintains a continuous high voltage level at a high voltage supply node, and the semiconductor device also includes a bit line decoder connected to the bit lines and the high voltage supply node and controlling access to the selected memory cells for high voltage operations by sequentially providing the high voltage level to a first portion of the bit lines, discharging the first portion of the bit lines, providing the high voltage level to a second portion of the bit lines, and discharging the second portion of the bit lines.

In accordance with another aspect of the present invention, the bit line decoder provides a high voltage level to a first portion of the bit lines for a predetermined time interval to program a first portion of the selected memory cells, precharges a second portion of the bit lines during the same time interval, and thereafter provides the high voltage level to the second portion of the bit lines to program a second portion of the selected memory cells.

In accordance with an additional aspect of the present invention, the high voltage generator provides the high voltage level to a first and a second high voltage node and includes a current flow control device to decouple the first high voltage node from the second high voltage node. A word line decoder is coupled to the first high voltage node and provides the high voltage level from the first high voltage node to selected word lines for programming of the selected memory cells and a bit line decoder is coupled to the second high voltage node and selectively connects the second high voltage node to selected bit lines to provide the high voltage level to the selected memory cells for programming thereof. The bit line decoder provides a boosting voltage from the high voltage generator to the selected bit lines at a predetermined time to overcome a voltage level drop resulting from the capacitor load associated with the selected bit lines.

In accordance with yet another aspect of the present invention, the semiconductor memory device also includes dynamic reference cells coupled to the plurality of word lines and static reference cells. The high voltage generator is coupled to the word lines, the bit lines and the dynamic and static reference cells for generating a high voltage level and selectively providing it to the word lines, the bit lines, the dynamic reference cells and/or the static reference cells and includes a first high voltage source and a second high voltage source. A sensing circuit includes a first sensing circuit coupled to the plurality of memory cells and the dynamic reference cells and a second sensing circuit coupled to the static reference cells and the first sensing circuit. The sensing circuit performs high voltage read operations of selected memory cells and the first and second sensing circuits and performs blank check operations on the dynamic reference cells. Control logic determines whether the dynamic reference cells are blank with respect to the static reference cells by providing non-identically regulated high voltage levels from a first high voltage source to the dynamic reference cells and from a second high voltage source to the static reference cells and, in response to determining that the dynamic reference cells are not blank, signals the high voltage generator to perform the high voltage read operation of the selected memory cells by switching the second high voltage source to provide identically regulated high voltage levels from the first high voltage node to the selected memory cells and the dynamic reference cells and from the second high voltage node to the static reference cells.

BRIEF DESCRIPTION OF THE DRAWINGS

The present invention will hereinafter be described in conjunction with the following drawing figures, wherein like numerals denote like elements.

FIG. 22 is a timing diagram for a read operation in accordance with the fourth embodiment of the present invention.

DETAILED DESCRIPTION OF THE INVENTION

Figure 1:
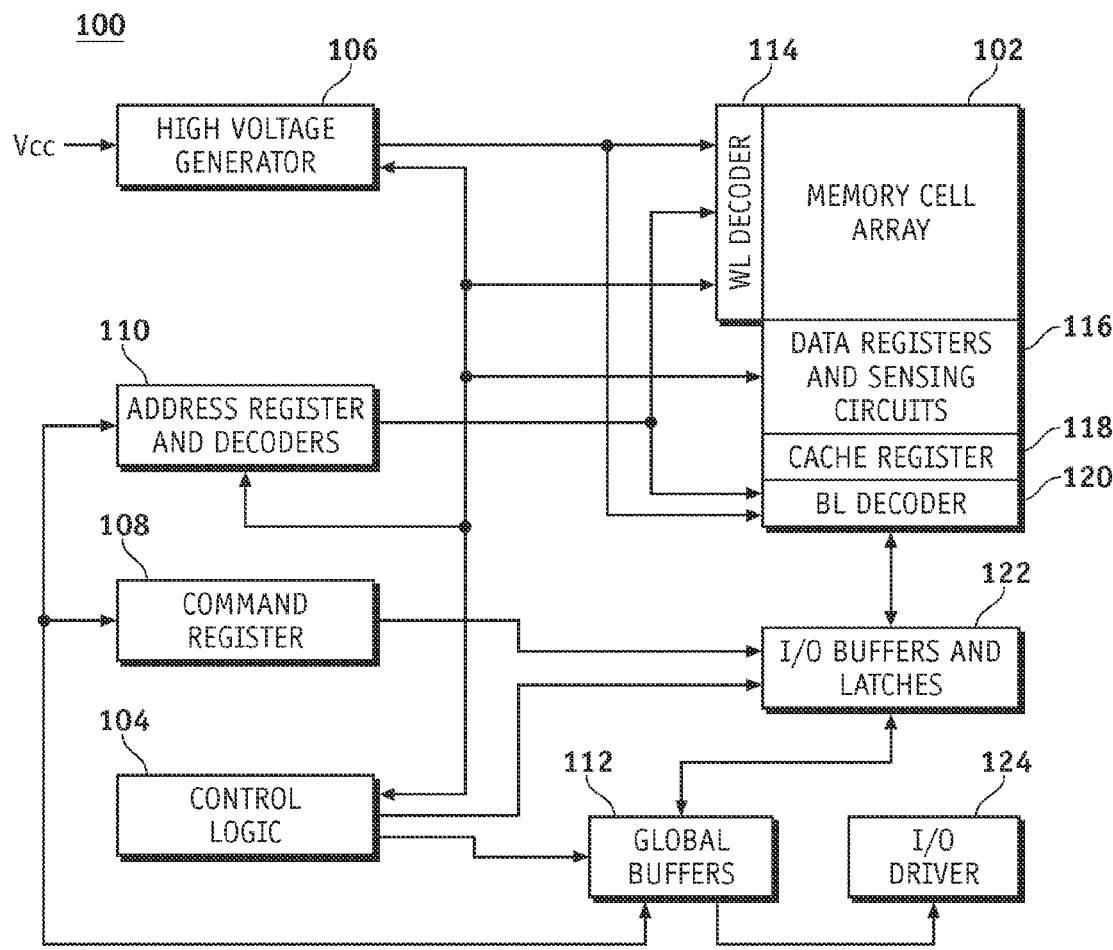
FIG. 1 is a block diagram of a semiconductor memory device in accordance with an embodiment of the present invention.

Referring to FIG. 1, a non-volatile semiconductor memory device 100, such as a flash memory device, includes a memory cell array 102, control logic 104 such as a state machine, a high-voltage generator 106, a command register 108, an address register and decoder 110, a global buffer 112, a word line decoder 114, a data register and sensing circuit 116, a cache register 118, a bit line decoder 120 for performing word line decoding, an Input/Output (I/O) buffer and latch circuit 122, and an input/output driver 124.

The memory cell array 102 includes a plurality of rewritable non-volatile memory cells that are arranged along word lines and bit lines in a matrix fashion well-known to those skilled in the art. In order to perform a high voltage operations, such as a programming operation, an erase operation or a read operation, selected memory cells from among the plurality of memory cells are selected by providing high voltage levels on word lines and bit lines associated with the selected memory cells (and in the case of read operations, selecting reference cells (dynamic or static)). The state machine 104 controls the operation of each circuit in the device in response to each control signal.

In accordance with the present invention, the high-voltage generator 106 generates voltage signals having high voltage levels that are used within the semiconductor device for memory operations thereof by applying the high voltages to selected cells within the memory cell array 102 via the word line decoder 114 and the bit line decoder 120. The high voltage signals used within the semiconductor memory device include voltage signals with a high voltage level for writing data, a high voltage level for erasing data, a high voltage level for reading data, and a verifying high voltage level for checking whether sufficient write/erase has been performed on a subject memory cell at the time of writing or erasing data.

The command register 108 temporarily stores operation commands that are input through the global buffer 112. The address register and decoder 110 temporarily stores input address signals. The I/O buffer and latch circuit 122 controls various signals or data corresponding to I/O terminals. The input/output driver 124 controls the data to be output from the semiconductor memory device 100 and the data to be input thereto.

Figure 2:
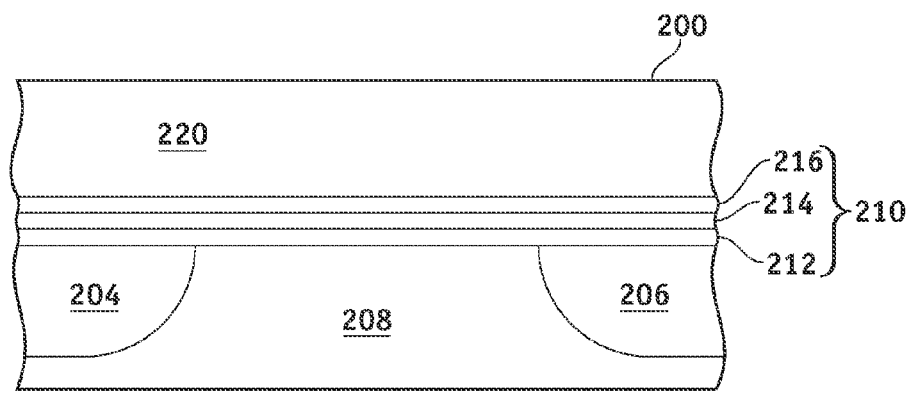
FIG. 2 is a diagram of a multi-bit memory cell in accordance with the embodiments of the present invention.

Referring to FIG. 2, a multi-bit, non-volatile memory cell 200 of the memory cell array 102 in accordance with embodiments of the present invention is provided on a semiconductor substrate 202 having a source 204 and drain 206 formed therein with a channel region 208 formed therebetween. An oxide-nitride-oxide (ONO) layer 210 is formed on the substrate 202 having a lower oxide layer 212, a nitride charge trapping layer 214 and a protective oxide layer 216. A polysilicon word line 220 is formed on the ONO layer 210.

As the charge trapping nitride layer 214 is insulative, multiple bits of data can be stored as electron charge in a localized storage region therein through a high voltage programming operation. In accordance with the embodiment of the present invention, the multi-bit memory cell is a two-bit memory cell and there are two localized storage regions formed in the nitride charge trapping layer 214 above the source 204 and the drain 206. The source 204 and the drain 206 of each memory cell 200 is coupled to a bit line for performing program, erase and read operations.

Figure 3:
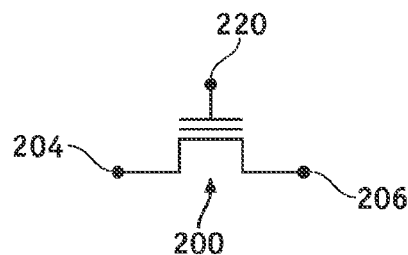
FIG. 3 is a schematic diagram of the multi-bit memory cell in accordance with the embodiments of the present invention.

Referring to FIG. 3, a schematic diagram of the memory cell 200 in accordance with the present invention reveals that each memory cell is a transistor 200 with the polysilicon word line 220 controlling the flow of current between the source 204 and the drain 206. To access the two bits of the memory cell 200, the source 204 and the drain are interchangeable.

Figure 4A:
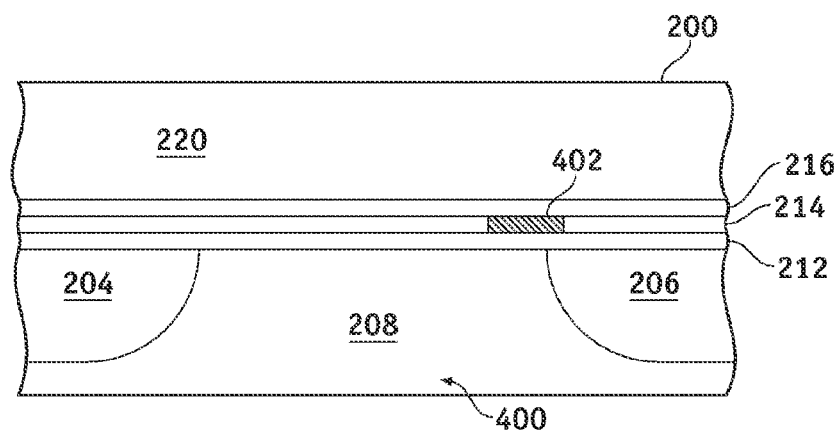
FIG. 4, consisting of FIGS. 4A and 4B, depicts an erase operation on the multi-bit memory cell of FIG. 2 in accordance with a first embodiment of the present invention.
Figure 4B:
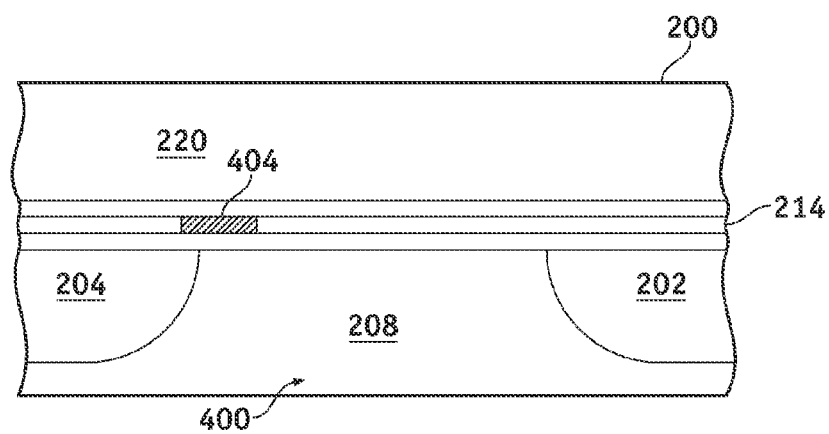

Referring to FIG. 4, consisting of FIGS. 4A and 4B, an erase operation on the two-bit memory cell of FIG. 2 in accordance with a first embodiment of the present invention is depicted wherein FIG. 4A depicts erasing a first, or right, bit 402 of the two-bit memory cell 200 and FIG. 4B depicts erasing a second, or left, bit 404 of the two-bit memory cell 200. The high voltage erase operation uses band-to-band hot hole injection into the nitride layer to neutralize the electrons trapped therein.

Referring to FIG. 4A, the first bit 402 is erased by providing a high voltage level of −6 volts to the word line 220 and +4 volts to the drain 206; the open end (i.e., the source 204) remains floating. In this manner, the hot holes 410 are injected from the drain 206 into the channel 208 and the first bit 402 formed in a localized region above the portion of the channel 208 adjoining the drain 206, thereby neutralizing the electrons stored in the first bit 402.

Referring to FIG. 4B, the second bit 404 is erased in a similar manner by providing a high voltage level of −6 volts to the word line 220 and +4 volts to the source 204; the open end (i.e., the drain 206) remains floating. Thus, the hot holes 410 are injected from the source 204 into the channel 208 and the second bit 404 formed in a localized region above the portion of the channel 208 adjoining the source 204, thereby neutralizing the electrons stored in the second bit 404.

Accordingly, in a high voltage erase operation of a two-bit memory cell 200, different bits 402, 404 are erased separately and the bit line connected to the open end (whether it is the source 204 or the drain 206) remains floating to enable erase of the bit 402, 404 on the other side.

Figure 5:
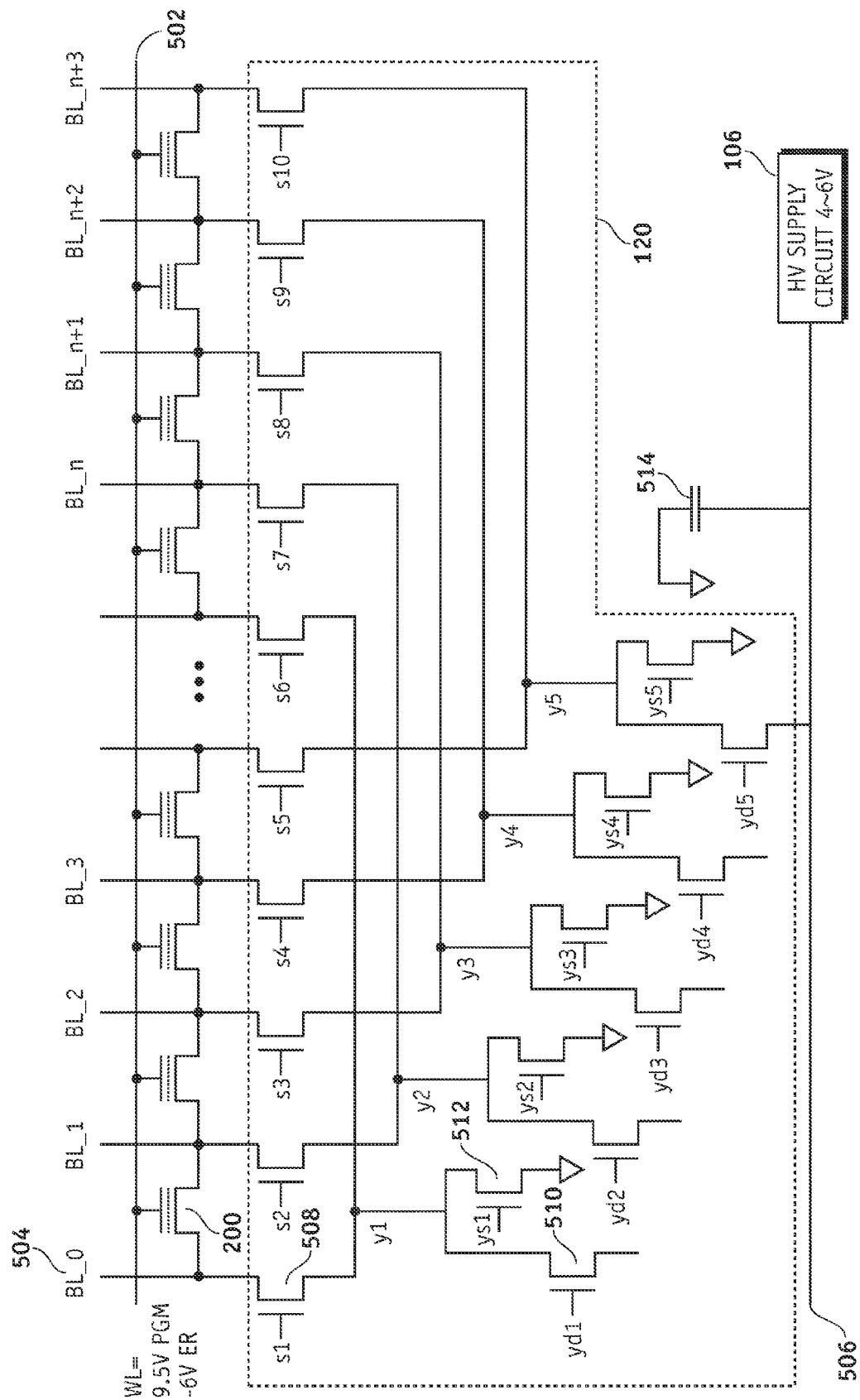
FIG. 5 is a timing chart for the erase operation in accordance with the first embodiment of the present invention.

Referring to FIG. 5, a diagram of memory cells 200 coupled to one of the plurality of word lines 502 and the plurality of bit lines 504 schematically shows details of portions of the bit line decoder 120 controlling the provision of a high voltage level from a high voltage node 506 coupled to the high voltage generator 106 to the plurality of bit lines 504. The plurality of bit lines 504 are coupled to the high voltage node 506 in a predetermined number of groups (e.g. in five groups, as shown). The bit line decoder 120 includes three transistors 508, 510 and 512 for controlling the coupling of each group of the plurality of bit lines 504 to the high voltage node 506. A capacitor 514 is also coupled to the high voltage node 506 for controlling the provision of current therefrom.

Figure 6:
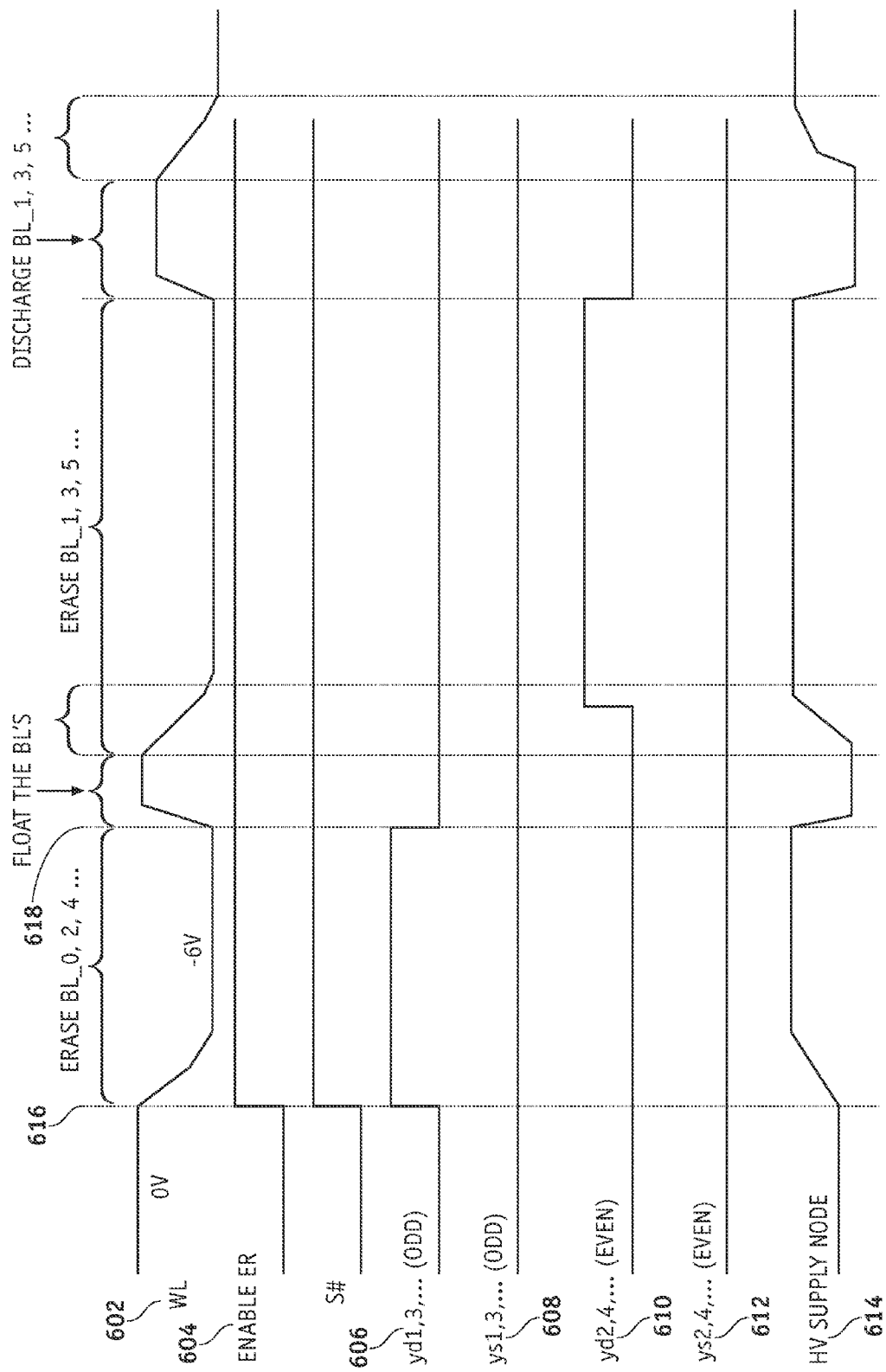
FIG. 6 is a timing chart for a conventional erase operation.

FIG. 6 depicts a timing chart for a conventional erase operation where signals are shown for the word line 502 voltage level 602, the erase enable (enable ER) 604, gate signals 606 provided to transistors 510 connected to a first portion of the bit lines 504 (in this case the odd numbered groups of the plurality of bit lines 504), gate signals 608 provided to transistors 512 connected to the first portion of the bit lines 504, gate signals 610 provided to transistors 510 connected to a second portion of the bit lines 504 (in this case the even numbered groups of the plurality of bit lines 504), gate signals 612 provided to transistors 512 connected to the second portion of the bit lines 504, and the high voltage level 614 at the high voltage supply node 506.

As can be seen from the timing chart of FIG. 6, when erase is enabled at a first time 616, the first portion of the bit lines 504 are coupled to the high voltage supply node 506 by providing a high signal 606 to the gates of the transistors 510 thereof, the high voltage supply level 614 charges up and the word lines 502 eventually reach minus 6 volts. At a time 618, when the first portion of the bit lines 504 are disconnected from the high voltage supply node 506, the bit lines 504 are floated and, as the first portion of the bit lines 504 are discharged, the high voltage level 614 on the high voltage supply node 506 loses charge. Thus, either before or when the second portion of the bit lines 504 are coupled to the high voltage supply node 506 by providing a high signal 610 to the gates of the transistors 510 thereof, the high voltage supply level 614 must charge up before the word lines 502 can be at minus 6 volts. It can, therefore, be seen that both power is wasted and time is lost while the high voltage supply node 506 is charging up and while the word line is reaching its erase voltage.

In accordance with the first embodiment of the present invention, however, an improved method for high voltage operation on selected memory cells 200 is provided which increases the speed of high voltage operations while conserving power expended in the operations. The improved method includes the steps of providing a continuous high voltage level on selected word lines 502 and maintaining a continuous high voltage level at the high voltage supply node 506 connected to the bit line controller 120, the bit line controller 120 controlling access to the selected memory cells 200 for high voltage operation thereon by sequentially providing the high voltage level from the high voltage supply node 506 to a first portion of the bit lines 504, discharging the first portion of the bit lines 504, providing the high voltage level to a second portion of the bit lines 504, and discharging the second portion of the plurality of bit lines 504. By discharging the bit lines 504 locally within the bit line controller 120 by signals supplied to the transistors 510, the high voltage supply node 506 can be maintained at a continuous high voltage level.

Figure 7:
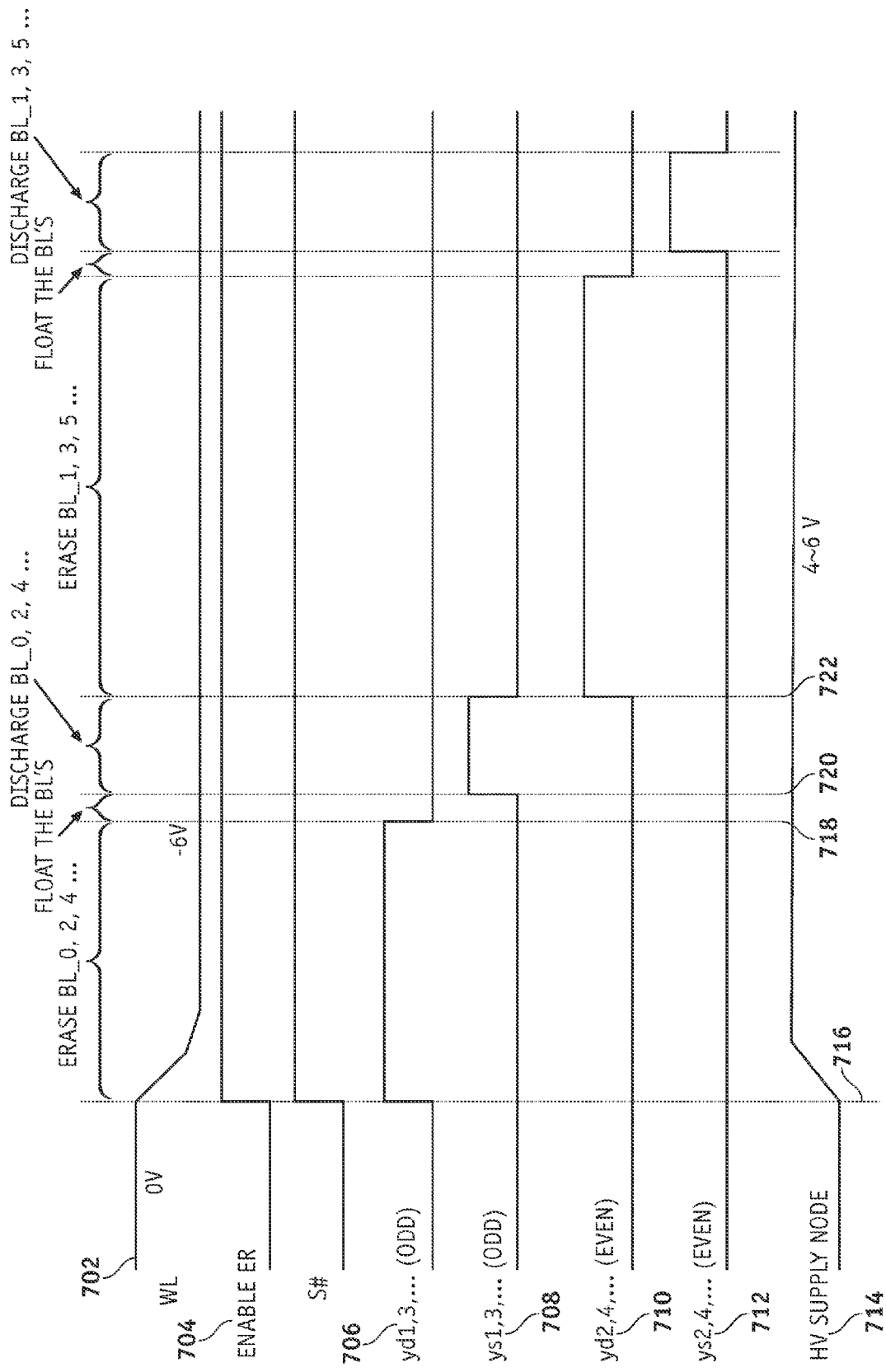
FIG. 7 is a schematic diagram of a bit line decoder 120 in accordance with the first embodiment of the present invention.

Referring next to FIG. 7, operation of the high voltage erase operation in accordance with the present invention is depicted by showing signals for the word line 502 voltage level 702, the erase enable (enable ER) 704, gate signals 706 provided to transistors 510 connected to the first portion of the bit lines 504, gate signals 708 provided to transistors 512 also connected to the first portion of the bit lines 504, gate signals 710 provided to transistors 510 connected to the second portion of the bit lines 504, gate signals 712 provided to transistors 512 also connected to the second portion of the bit lines 504, and the high voltage level 714 at the high voltage supply node 506.

As can be seen from the timing chart of FIG. 7, when erase is enabled at a first time 716, the first portion of the bit lines 504 are coupled to the high voltage supply node 506 by providing a high signal 706 to the gates of the transistors 510 thereof, the high voltage supply level 714 charges up and the voltage level 702 of the word lines 502 reach minus 6 volts. Thereafter, the voltage level 702 of the word lines 502 and the high voltage level 714 of the high voltage supply node 506 are continuously maintained at their high voltage level. At a time 718, when the first portion of the bit lines 504 are disconnected from the high voltage supply node 506, the bit lines 504 are floated while the high voltage levels 702, 714 are unaffected. In accordance with the present invention, at time 720 the first portion of the bit lines 504 are locally discharged within the controller by providing a signal to the gate of the transistors 512 coupled to the first portion of the bit lines 504 to discharge the bit lines to ground through the transistors 512.

In this manner, at time 722 when the discharge of the first portion of the bit lines 504 is completed, the necessary voltages can be immediately provided to the word lines 502 and the second portion of the bit lines 504, therefore reducing power consumption by the high voltage erase operation as well as speeding the erase operation. For the high voltage erase operation, as discussed earlier minus 6 volts is provided to the word lines 502 and 4 volts is provide to the bit lines 504. The improved method for high voltage operation in accordance with the first embodiment of the present invention is also applicable to high voltage programming operations where 9 volts is provided to the word lines 502 and 4 volts is provide to the bit lines 504.

Figure 8A:
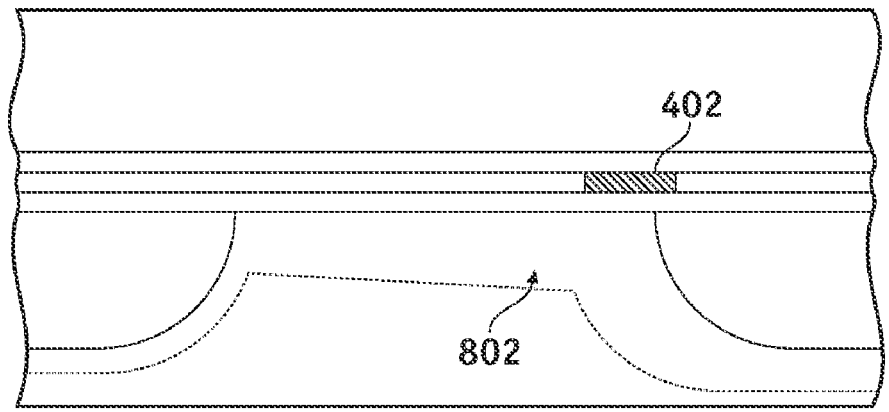
FIG. 8, consisting of FIGS. 8A and 8B, depicts a program operation on a multi-bit memory cell of FIG. 2 in accordance with a second embodiment of the present invention.
Figure 8B:
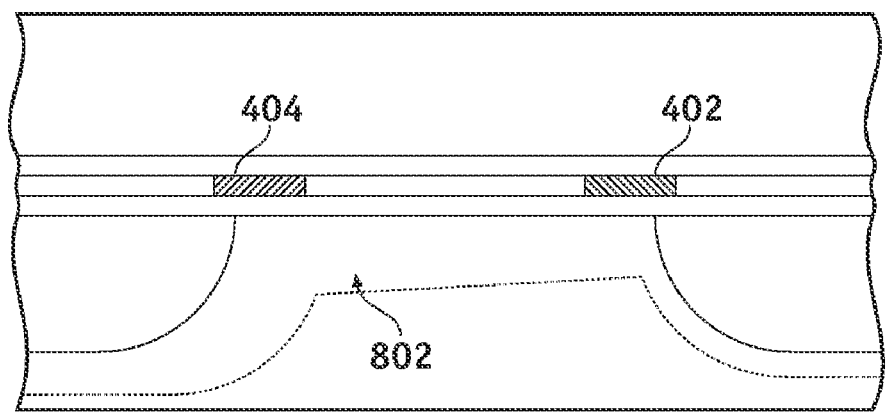

Referring to FIG. 8, consisting of FIGS. 8A and 8B, a programming operation on the two-bit memory cell of FIG. 2 in accordance with the embodiments of the present invention is depicted wherein FIG. 8A depicts programming a first, or right, bit 402 of the two-bit memory cell 200 and FIG. 8B depicts programming a second, or left, bit 404 of the two-bit memory cell 200. The high voltage programming operation uses channel hot electron injection into the nitride charge trapping layer to inject electrons 802 thereinto for trapping therein, thereby programming the bit 402, 404.

Referring to FIG. 8A, the first bit 402 is programmed by providing a high voltage level of 9 volts to the word line 220, 4 volts to the drain 206 and 0 volts to the source 204. In this manner, the hot electrons 802 passing through the channel 208 from the source 204 to the drain 206 are injected from the channel 208 into the first bit 402 formed in a localized region above the portion of the channel 208 adjoining the drain 206.

Referring to FIG. 8B, the second bit 404 is programmed in a similar manner by providing a high voltage level of 9 volts to the word line 220, 4 volts to the source 204 and 0 volts to the drain 206. Thus, the electrons 802 are injected from the channel 208 as they flow from the drain 206 to the source 204 and the second bit 404 formed in a localized region above the portion of the channel 208 adjoining the source 204 is programmed.

Accordingly, in a high voltage programming operation of a two-bit memory cell 200, different bits 402, 404 are programmed separately and, since the profile of electrons in a programmed bit is dependent on the junction profile and the ratio of the word line 220 voltage to the drain 206 voltage, the charge profile of the second bit 404 is wider than that of the first bit 402.

Figure 9:
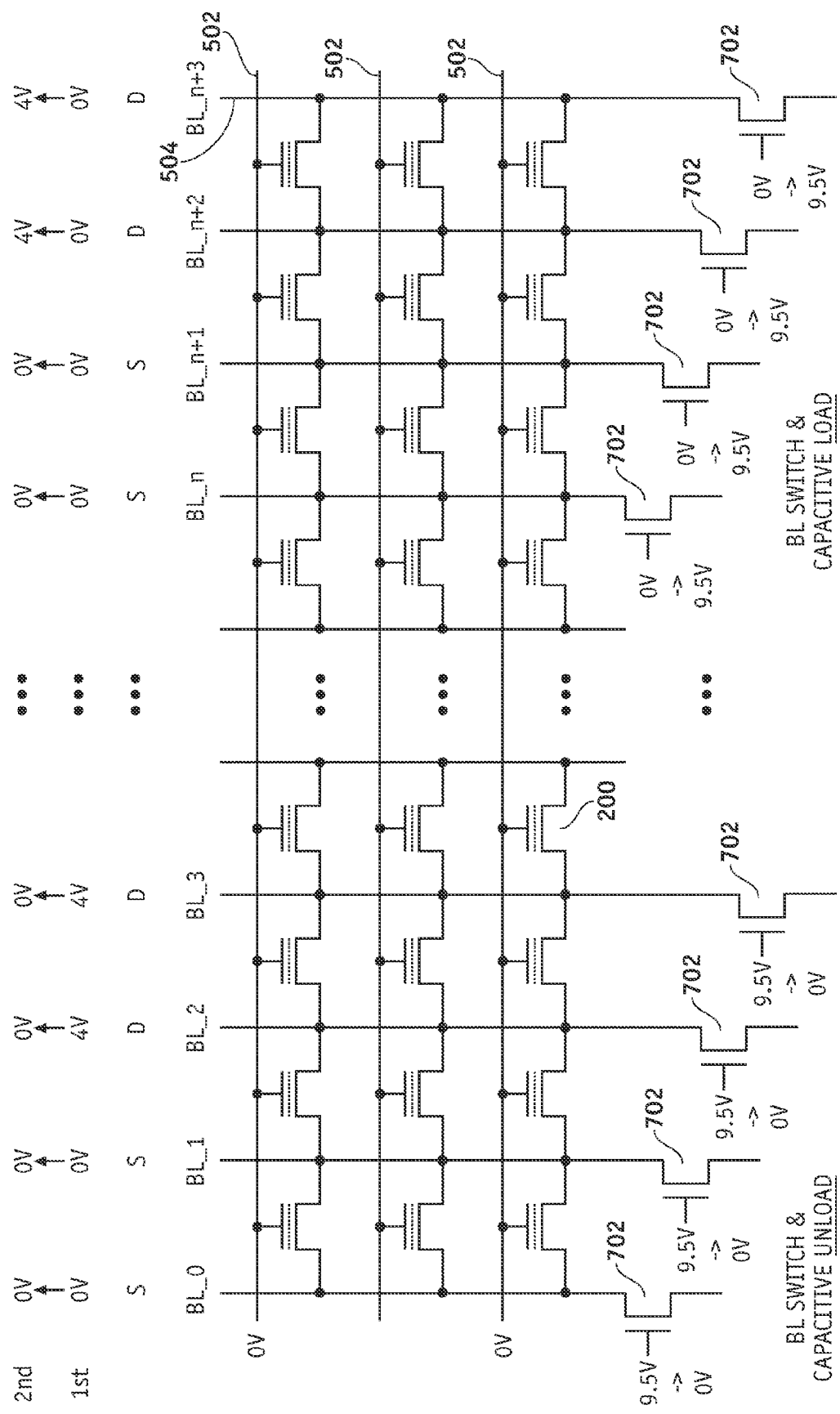
FIG. 9 is a schematic diagram depicting bit line switching utilizing high voltage pass gates in the bit line decoder 120 during programming in accordance with the second embodiment of the present invention.

Referring to FIG. 9, a diagram of memory cells 200 coupled to word lines 502 and bit lines 504 shows how programming of the two bits 402, 404 of the memory cell 200 is accomplished keeping a word line 502 at 9.5 volts and switching selected bit lines 504 between 0 volts and 4 volts by switching on and off bit line decoding pass transistors 902.

Figure 10:
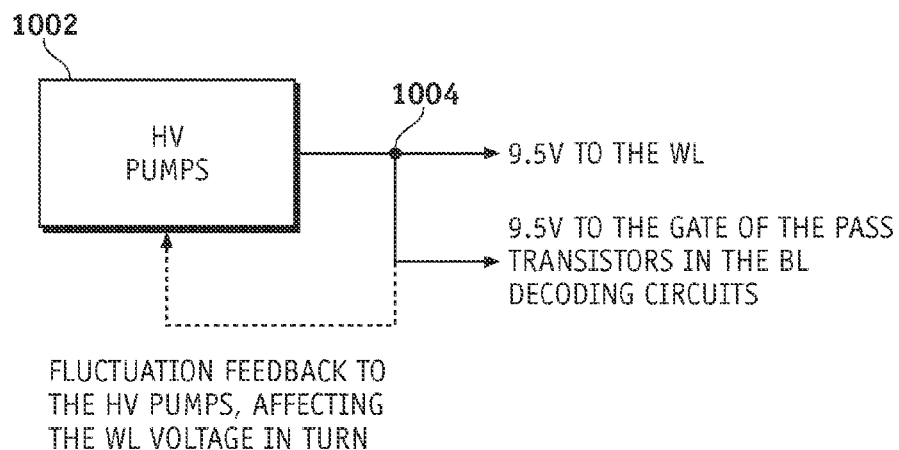
FIG. 10 is a block diagram of high voltage during programming in accordance with conventional programming techniques.

Referring to FIG. 10, high voltage drain pumps 1002 of the high voltage generator 106 provide high voltage to a high voltage supply node 1004 coupled to both the word lines 502 and the gates of the pass transistors 902. Since the word line 502 is coupled to the same high voltage supply node 1004 as the gates of bit line decoding pass transistors 902, the switching of the bit lines 504 utilizing the bit line decoding pass transistors 902 provides a capacitive load and/or unload on the high voltage supply node 1004. Accordingly, fluctuations feedback to the high voltage drain pumps 1002 which affect the word line 502 high voltage level.

Figure 11:
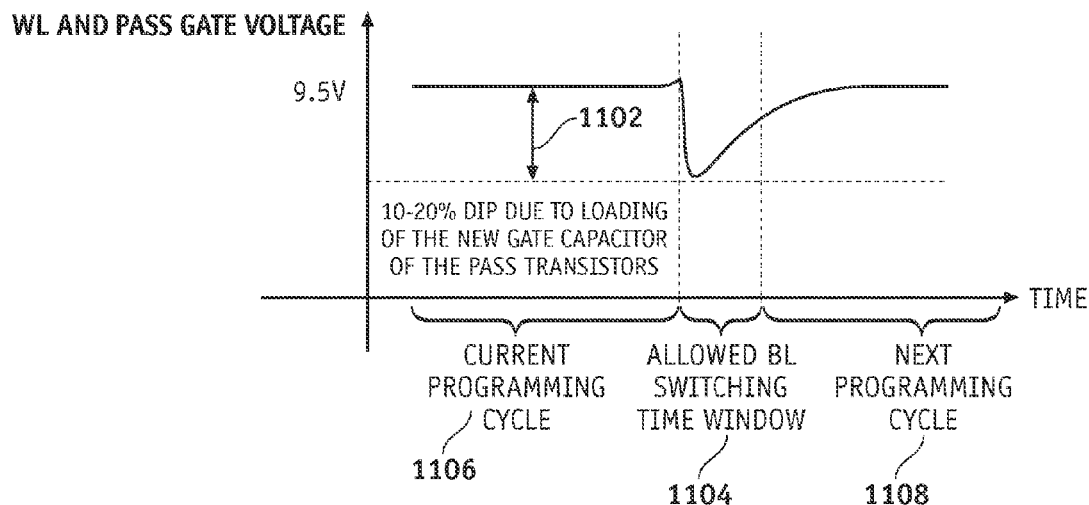
FIG. 11 is a graph of high voltage during programming in accordance with conventional programming techniques.

In addition, the switching of the bit lines 504 causes "dips" in the high voltage level of the high voltage supply node, thereby increasing the time necessary for programming and preventing the high voltage supply node from recovering in a timely manner. This "dip" is shown in FIG. 11 where the twenty percent "dip" 1102 due to the loading of the new gate capacitor of the pass transistors prevents the high voltage level from recovering during an allowed bit line switching window 1104 between a current programming cycle 1106 and a next programming cycle 1108. Since the high voltage level at the high voltage supply node 1004 cannot recover before the end of the allowed bit line switching window 1104, word line 502 instability is caused and programming discrepancies are likely during the next programming cycle 1108.

Figure 12:
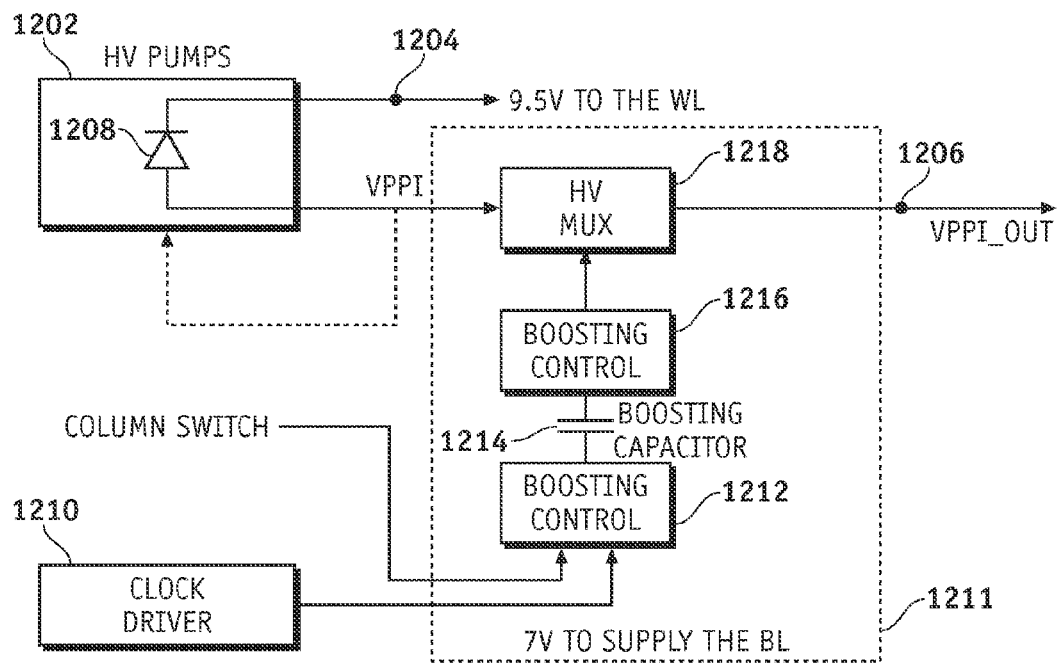
FIG. 12 is a block diagram of high voltage during programming in accordance with the second embodiment of the present invention.

Referring to FIG. 12, high voltage drain pumps 1202 in accordance with a second embodiment of the present invention provide a first high voltage node 1204 coupled to the word line 502 and a second high voltage node 1206 coupled to the gates of the bit line decoder pass transistors 902 for programming of memory cells 200. A current flow control device 1204, such as a diode, is provided in the drain pumps 1202 to decouple the first high voltage node 1204 from the second high voltage node 1206. As the first and second high voltage nodes 1204, 1206 are decoupled, a higher voltage level (e.g., 10 volts) can be applied to the second high voltage node 1206 than the voltage level (e.g., 9.5 volts) applied to the first high voltage node 1204.

In addition, a boosting voltage is provided to the second high voltage node 1206 to hasten recovery from the voltage level drop resulting from the capacitor load associated with the switching of the bit lines 504. The timing of the boosting voltage is controlled by a clock signal from a clock driver 1210 in the control logic 104 (FIG. 1) and a column switch signal, both signals provided to a boosting circuit 1211. Within the boosting circuit 1211, the clock signal and the column switch signal are provided to a first portion of boosting control 1212. The first portion 1212 provides a driver voltage to a bottom plate of the boosting capacitor 1214 which pushes the voltage higher on the top plate of the boosting capacitor 1214. The top plate of the boosting capacitor 1214 is connected to a second portion of boosting control 1216. The second portion 1216 generates a boosting voltage, and the output of the second portion 1216 is combined with the voltage VPPI provided from the high voltage drain pump 1202 by, for example, a high voltage multiplexer 1218, the combination VPPI_OUT being supplied from the boosting circuit 1211 to the second high voltage node 1206.

Figure 13:
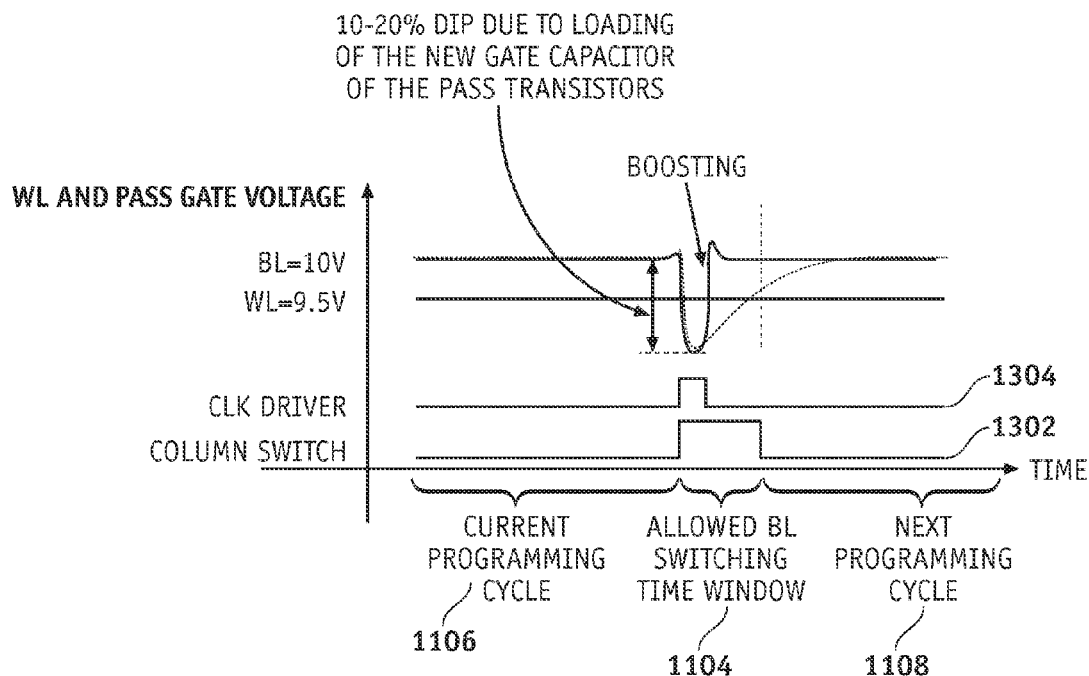
FIG. 13 is a graph of high voltage during programming in accordance with the second embodiment of the present invention.

Utilizing the high voltage control circuitry of FIG. 12 does not prevent the ten to twenty percent dip due in the high voltage level due to loading of the new gate capacitor of the pass transistors 902. However, as can be seen in FIG. 13, the activation of the column switch signal 1302 and the clock driver signal 1304 during the allowed bit line switching time window 1104 in accordance with the second embodiment of the present invention results in a fast recovery, well within the allowed time window 1104. In addition, decoupling the first high voltage node 1204 from the second high voltage node 1206 prevents the dip in high voltage level at the second high voltage node 1206 from affecting the high voltage level provided to the word lines 502 (i.e., the word line voltage of 9.5 volts is unaffected by the dip). Further, the clock driver 1210 provides the boosting voltage to the second high voltage node 1206 a predetermined time interval after connecting the selected bit lines to the second high voltage node to guarantee that the high voltage level at the second high voltage node recovers before the start of the next programming cycle 11108.

Figure 14:
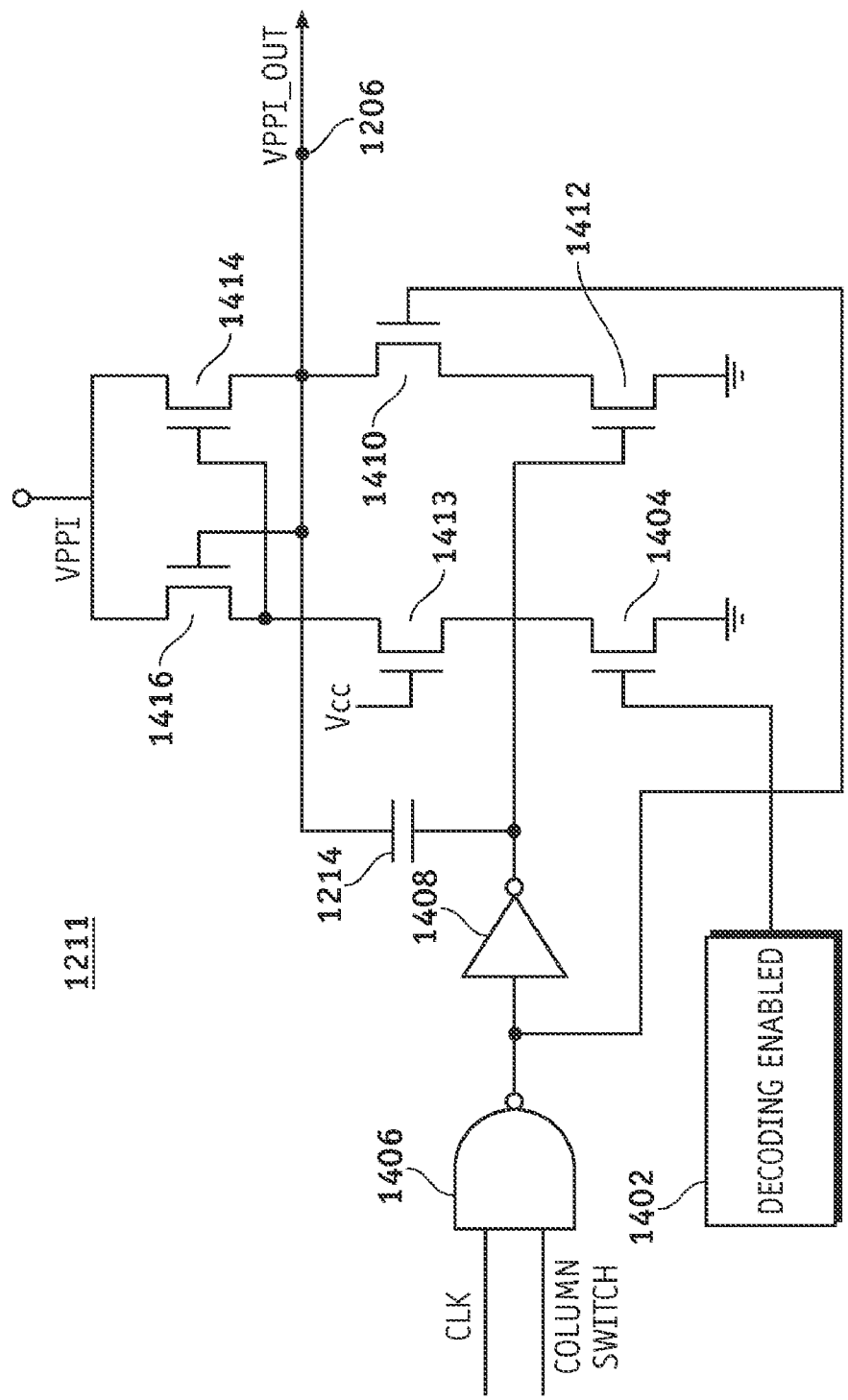
FIG. 14 is a schematic diagram of a high voltage boosting circuit in accordance with the second embodiment of the present invention.

Referring to FIG. 14, an example of the boosting circuit 1211 is depicted. A decoding enabled signal is supplied from a decoding enabler 1402 in the control logic 104 (FIG. 1) during the time that the high voltage programming operation is enabled to a gate of a transistor 1404, thereby enabling the boosting circuit 1211. The clock signal from the clock driver 1210 and the column switch signal from a decoding control circuit in the BL decoder 120 are supplied to an inverting adder 1406. The output of the adder 1406 is supplied to an inverter 1408 and the gate of a transistor 1410. The output of the inverter 1408 is provided to the gate of a transistor 1412 and to the bottom plate of the boosting capacitor 1214. When the clock signal and the column switch signal are both low, the voltage Vcc supplied to the gate of a transistor 1413, the source of which is connected to the gate of a transistor 1414, opens the transistor 1414 so that the voltage VPPI is provided to the gates of the pass transistors 902.

The column switch signal going high enables column switching and, when the clock signal goes high, a driver voltage is supplied to the low plate of the boosting capacitor 1214, pushing the voltage on the top plate higher. The higher voltage, i.e., the boosting voltage, is combined with the voltage VPPI by the switching of transistors 1414 and 1416 and supplied as the output VPPI_OUT of the boosting circuit 1211 to the second high voltage node 1206. Thus, referring back to FIG. 13, when both the clock signal 1302 and the column switch signal are high and VPPI "dips", the boosting voltage combined with VPPI is supplied to the gates of the pass transistors 902 (FIG. 9) coupled to the second high voltage node 1206.

Figure 15:
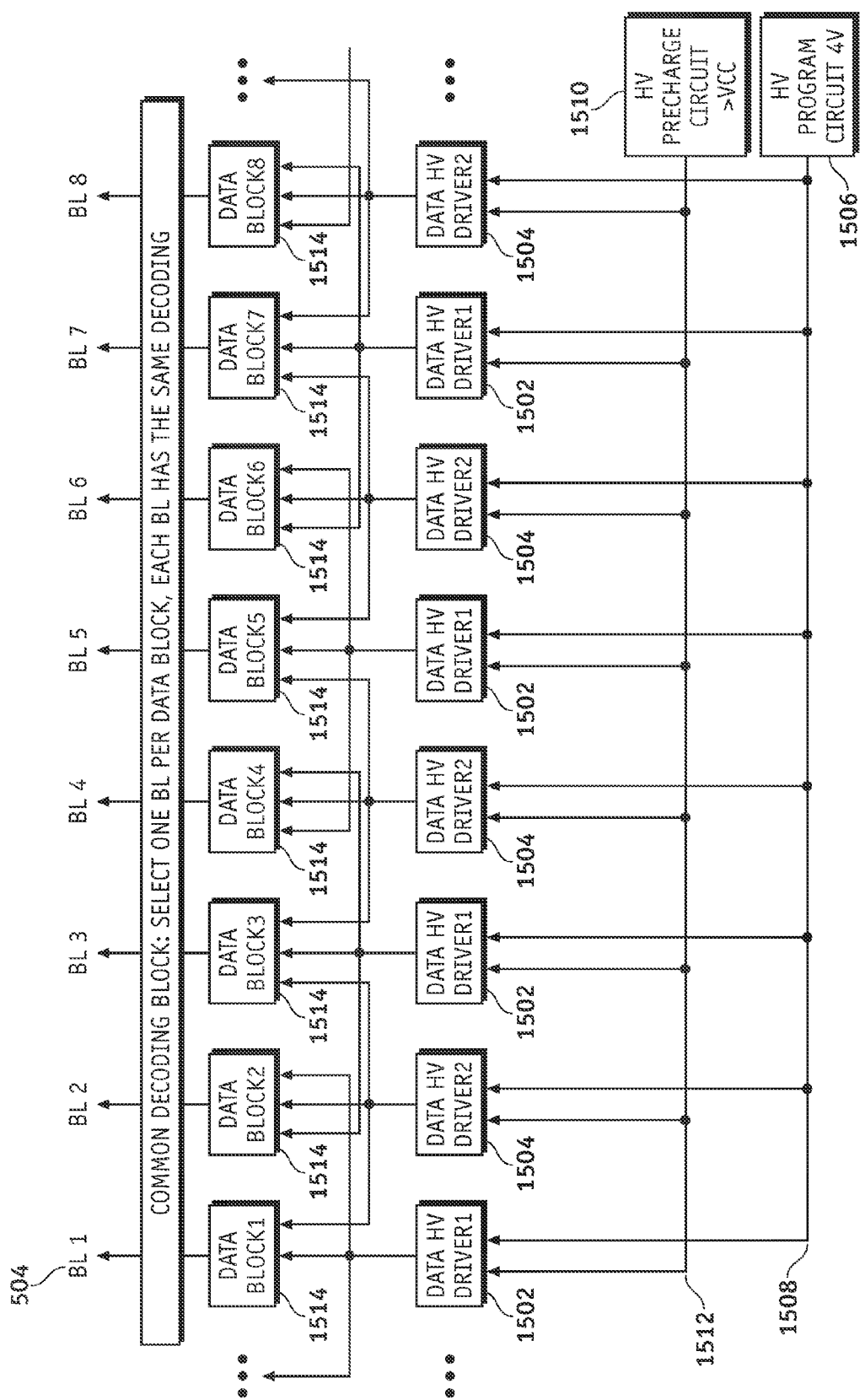
FIG. 15 is a block diagram of a bit line decoder 120 in accordance with a third embodiment of the present invention.

Referring to FIG. 15, a block diagram of a bit line decoder 120 in accordance with a third embodiment of the present invention includes a plurality of data high voltage drivers divided into two groups 1502, 1504. The data high voltage drivers 1502, 1504 are each connected to a high voltage program circuit 1506 which provides a high voltage level (e.g., approximately four volts during programming) to a high voltage node 1508 and to a high voltage precharge circuit 1510 which provides a high voltage level (e.g., greater than or equal to Vcc during precharging) to a high voltage node 1512. The outputs of each of the data high voltage drivers 1502, 1504 is coupled to a predetermined number of data block decoders 1514, each data block decoder 1514 coupled to a bit line 504 and performing decoding therefor. In addition to the advantages of the third embodiment of the present invention seen in the timing charts described hereinbelow, during programming the data high voltage drivers 1502, 1504 drive those data block decoders 1514 that they are connected to that perform substantially equivalent decoding of the bit lines 504. Thus, data block decoders 1514 that perform substantially equivalent decoding are activated simultaneously to reduce programming time.

Figure 16:
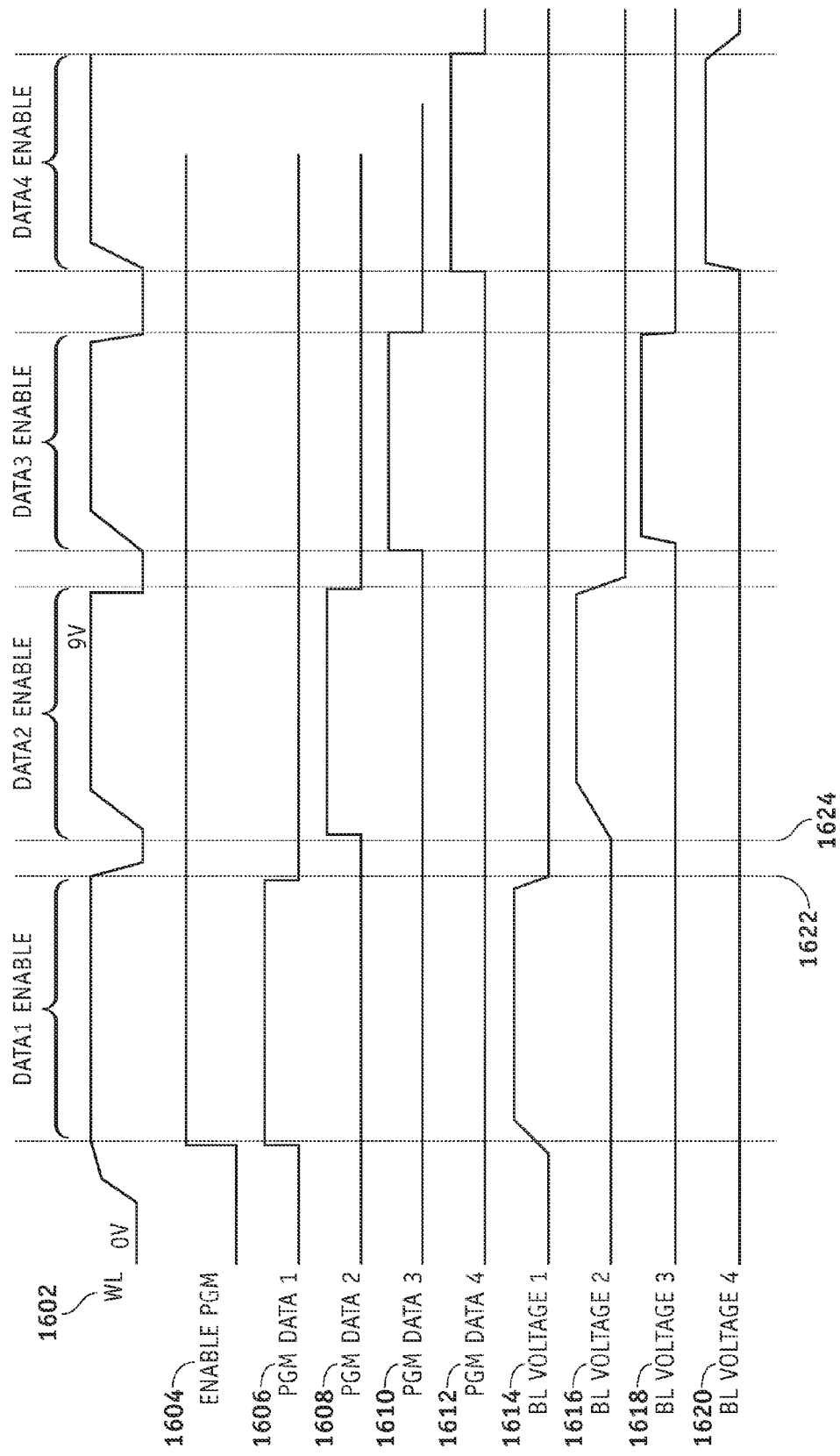
FIG. 16 is a timing chart depicting a conventional program operation.

FIG. 16 depicts a timing chart for a conventional programming operation where signals are shown for the word line voltage level 1602, the program enable (enable PGM) 1604, programming signals for data blocks one to four 1606, 1608, 1610, 1612, and, for the associated bit lines 504, bit line voltage levels 1614, 1616, 1618, 1620. Between the time that programming of data block one is disabled 1622 and the programming of data block two is enabled 1624, the high voltage supplied to the word lines 1602 is reset and the high voltage supplied to the data blocks 1514 is reset to disable the high voltage level supplied to data block one and, thereafter, enable the high voltage supplied to data block two. It can, therefore, be seen that both power and time are lost while the high voltage supply nodes coupled to the word lines 502 and the bit lines 504 are charging up.

In accordance with the third embodiment of the present invention, however, an improved method for high voltage programming of selected memory cells 200 is provided which increases the speed of high voltage programming while conserving power expended in the programming. The improved method includes the steps of providing a high voltage level to data blocks 1514 associated with a first portion of the bit lines 504 for a predetermined time interval to program a first portion of the selected memory cells 200, precharging a second portion of the bit lines 504 during the predetermined time interval that the high voltage level is provided to the data blocks 1514 and, thereafter, providing the high voltage level to data blocks 1514 associated with the second portion of the bit lines 504 for the predetermined time interval to program a second portion of the selected memory cells. During both the first and second predetermined time intervals, a continuous high voltage level is provided to selected word lines 502 associated with the selected memory cells 200. In addition, the first portion of the bit lines 504 are discharged during the second time interval (i.e., while the second portion of the bit lines is being programmed by providing the high voltage level to data blocks 1514 associated with the second portion of the bit lines 504.

Figure 17:
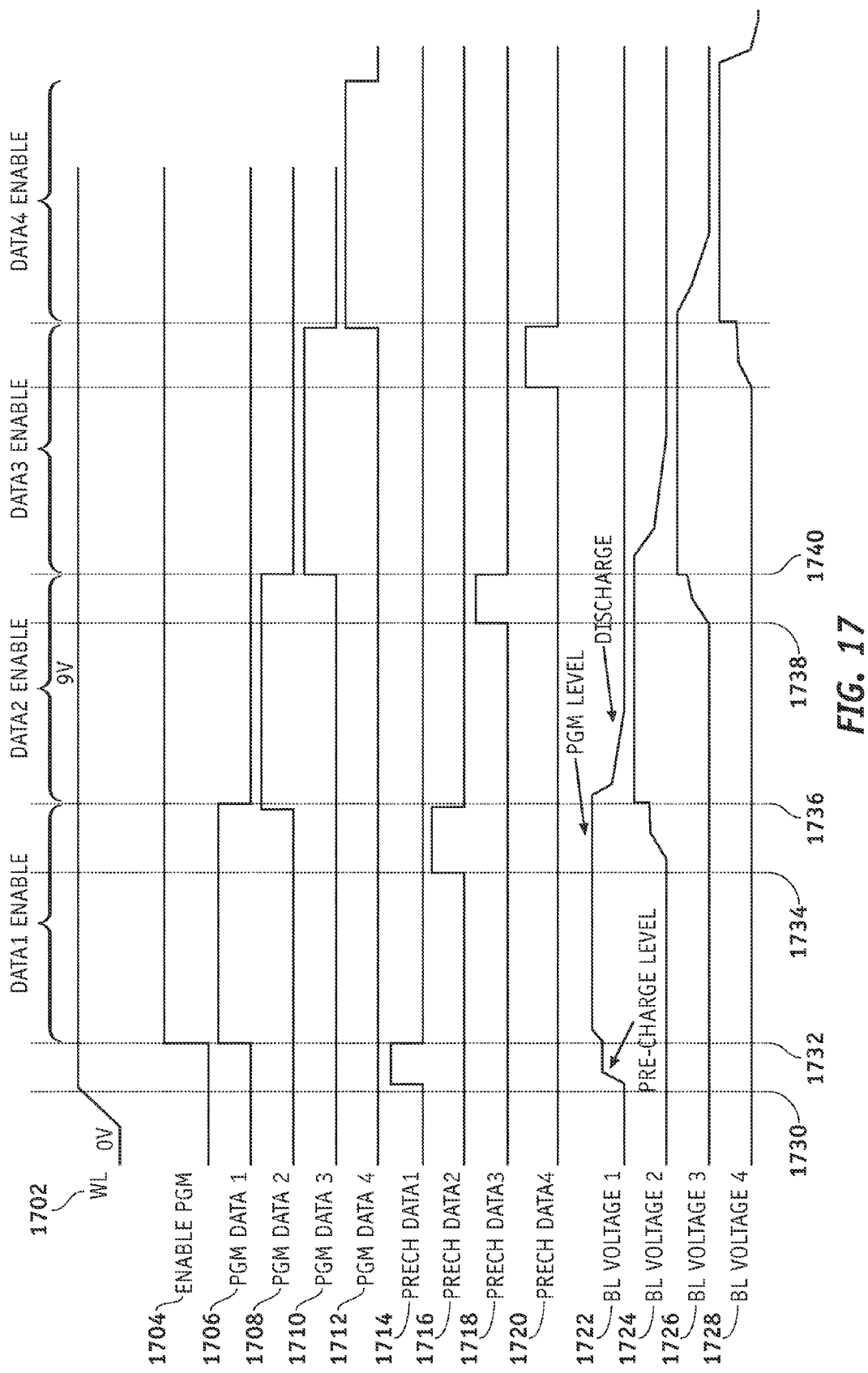
FIG. 17 is a timing chart depicting the program operation utilizing the bit line decoder 120 of FIG. 15 in accordance with the third embodiment of the present invention.

Referring next to FIG. 17, operation of the high voltage programming operation in accordance with the third embodiment of the present invention is depicted where signals are shown for the word line voltage level 1702, the program enable (enable PGM) 1704, programming signals for data blocks one to four 1706, 1708, 1710, 1712, precharging signals for data blocks one to four 1714, 1716, 1718, 1720, and bit line voltage levels 1722, 1724, 1726, 1728. As can be seen from the timing chart, before programming of the first data blocks is enabled at a time 1732, precharging of the first portion of the bit lines 1722 associated with the first data blocks is enabled and the voltage level provided to the first portion of the bit lines 1722 is precharged to a first voltage level less than the high voltage level necessary for programming (e.g., Vcc). Thus, when programming is enabled at time 1732, the voltage level of the first portion of the bit lines 1722 need only be further charged a minimal amount. At time 1734, precharging of the second portion of bit lines 1724 associated with the second data blocks 1514 occurs while the programming is enabled for the first portion of the bit lines 1722. In this manner, at time 1736 when programming is enabled for the second portion of the bit lines 1724, both power and time are saved as the programming is continuous from one data block 1514 to the next. In addition, programming of the disabled for the first portion of the bit lines 504 and discharge of the first portion of the bit lines 1722 is performed between time 1736 and 1738 while programming of the second portion of the bit lines 1724 occurs, further enabling the continuous programming from data block 1514 to data block 1514. In a like manner, between times 1738 and 1740, precharging 1718 of the third portion of bit lines 1726 associated with the third data blocks 1514 occurs while the programming is enabled 1708 for the second portion of the bit lines 1724.

Figure 18:
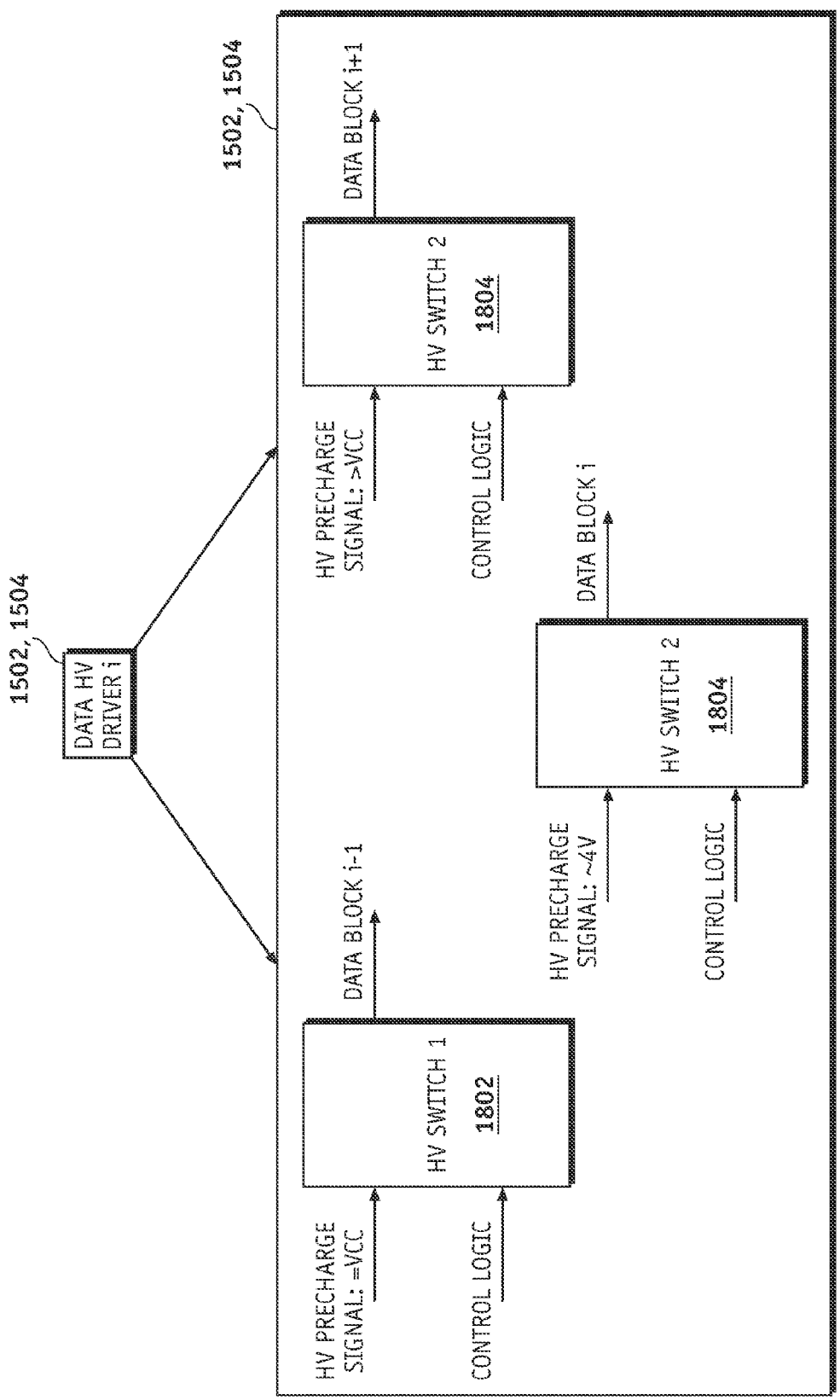
FIG. 18 is a diagram of the operation of a high voltage driver of FIG. 15 in accordance with the third embodiment of the present invention.

Referring to FIG. 18, operation of the high voltage drivers 1502, 1504 of FIG. 15 in accordance with the third embodiment of the present invention, is shown. The data high voltage drivers 1502, 1504 include a first high voltage switch 1802 for activation during precharge (e.g., in regards to a first bit line 1722, between time 1730 and time 1732) and a second high voltage switch 1804 for activation during programming (e.g., in regards to a first bit line 1722, between time 1732 and time 1736). Both switches 1802, 1804 operate in response to signals from the control logic 104 (FIG. 1).

Coupling each data high voltage driver 1502, 1504 to three data blocks (identified as Data block i−1, Data Block i and Data Block i+1) facilitates simultaneous precharge and programming operations, including precharging a portion of bit lines to a voltage level approximately equal to Vcc and further precharging the portion of bit lines to the programming voltage. For, example, where i=2, Data HV Driver2 1504 provides a precharge voltage equivalent to Vcc to Data Block 1 between times 1730 to 1732 by activation of the first high voltage switch 1802. Between times 1736 and 1740, Data HV Driver2 1504 provides a program voltage approximately equal to four volts to Data Block 2 by activation of the second high voltage switch 1804. As the second high voltage switch 1804 is provided a voltage higher than Vcc, at time 1740, a voltage higher than Vcc is supplied to Data Block 3 by signaling of the second high voltage switch 1804. Utilization of the data high voltage drivers 1502, 1504 in this manner reduces the amount of current consumed by high voltage programming, thereby improving the speed and power consumption of high voltage programming operations in accordance with this third embodiment of the present invention as compared to conventional high voltage programming operations.

Figure 19A:
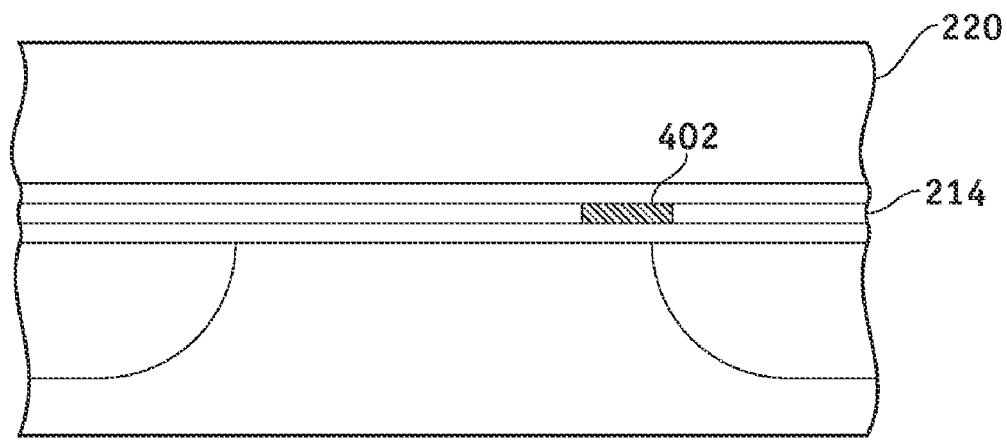
FIG. 19, consisting of FIGS. 19A and 19B, depicts a read operation on a multi-bit memory cell of FIG. 2 in accordance with a fourth embodiment of the present invention.
Figure 19B:
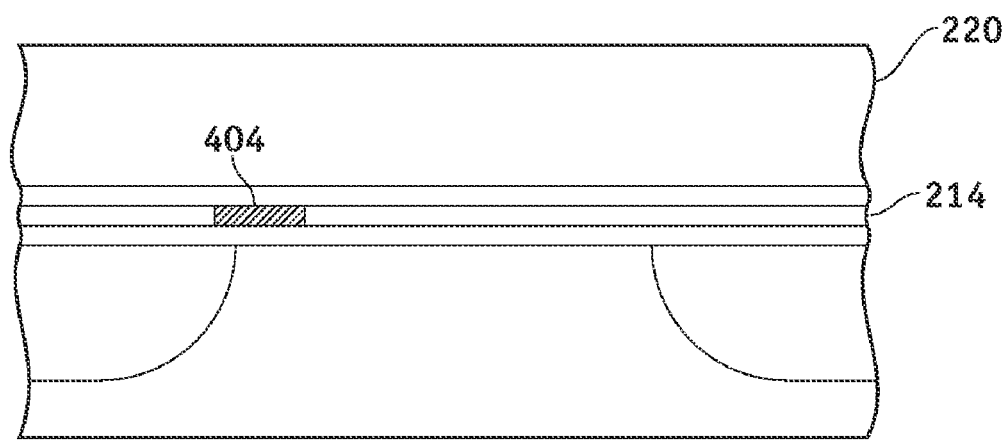

Referring to FIG. 19, consisting of FIGS. 19A and 19B, a read operation on the two-bit memory cell of FIG. 2 in accordance with a fourth embodiment of the present invention is depicted wherein FIG. 19A depicts reading a first, or right, bit 402 of the two-bit memory cell 200 and FIG. 19B depicts reading a second, or left, bit 404 of the two-bit memory cell 200. The high voltage read operation determines whether electrons are trapped in the localized region of the nitride charge trapping layer 214 corresponding to the first or second bit and comparing the voltage levels of those electrons with voltage levels in reference cells to read the bits. Referring to FIG. 19A, the first bit 402 is read by providing a high voltage level of five volts to the word line 220, zero volts to the drain 206 and 1.1 to 1.5 volts to the source 204. Referring to FIG. 19B, the second bit 404 is read by providing a high voltage level of five volts to the word line 220, 1.1 to 1.5 volts to the drain 206 and zero volts to the source 204. In this manner, the two bits 402, 404 are read separately.

Figure 20:
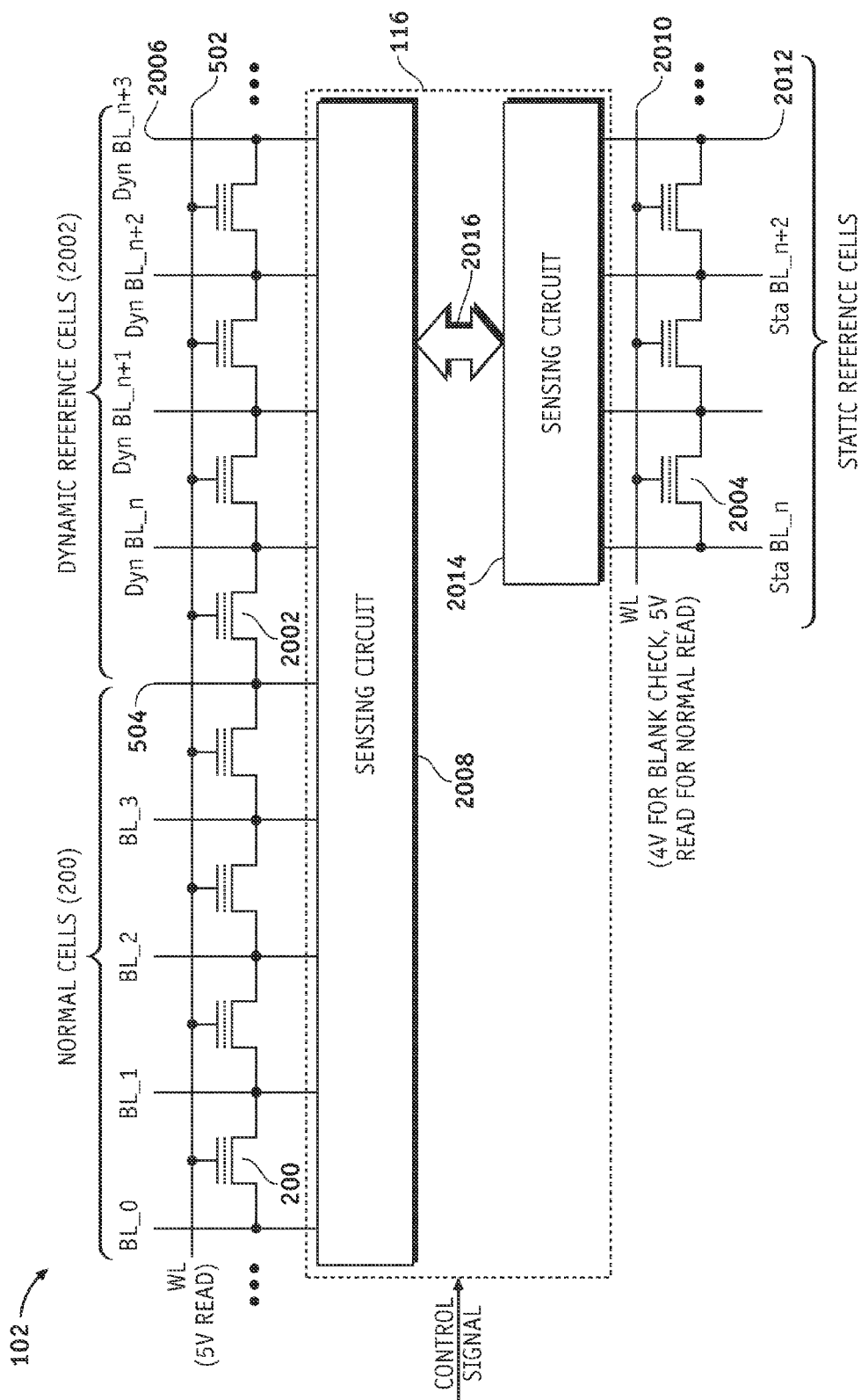
FIG. 20 is a schematic diagram of the memory cell array 102 and the sensing circuit 116 for a read operation in accordance with the fourth embodiment of the present invention.

In accordance with the fourth embodiment of the present invention, the semiconductor memory device 100 depicted in FIG. 20 includes both dynamic reference cells 2002 and static reference cells 2004. The memory cell array 102 includes the memory cells 200 coupled to one of the plurality of word lines 502 and the plurality of bit lines 504 and the dynamic reference cells 2002 coupled to the one of the plurality of word lines 502 and a plurality of dynamic reference cell bit lines 2006. The plurality of bit lines 504 and the dynamic reference cell bit lines 2002 are coupled to a sensing circuit 2008 of the data registers and sensing circuits 116 (FIG. 1). The plurality of static reference cells 2004 are coupled to a first static reference cell word line 2010 and a plurality of static reference cell bit lines 2012. The plurality of static reference cell bit lines 2012 are coupled to a second sensing circuit 2014 of the data registers and sensing circuits 116, the second sensing circuit 2014 coupled to the first sensing circuit 2014 by a bus 2016 for cooperatively performing blank check operations and other comparison operations in accordance with semiconductor memory read operations.

In accordance with the fourth embodiment of the present invention, the control logic 104, for each word line 502, performs a blank check operation by comparing the dynamic reference cells 2002 coupled to the word line 502 with the static reference cells 2004 to determine if the dynamic reference cells 2002 are blank. If the dynamic reference cells 2002 are blank, then the read operation for that word line 502 is skipped and processing proceeds to the next word line 502, thereby increasing the speed of the read operation. Identically regulated voltage levels are not required for the dynamic reference cells 2002 and the static reference cells 2004 during a blank check operation. Thus, since the word line 2010 for the static reference cells 2004 is shorter than the word line 502 for the memory cells 200 and the dynamic reference cells 2002, the static reference cells 2004 can be provided a voltage level lower than the voltage level provided to the dynamic reference cells 2002, thereby reducing power consumption during blank check operations.

Figure 21:
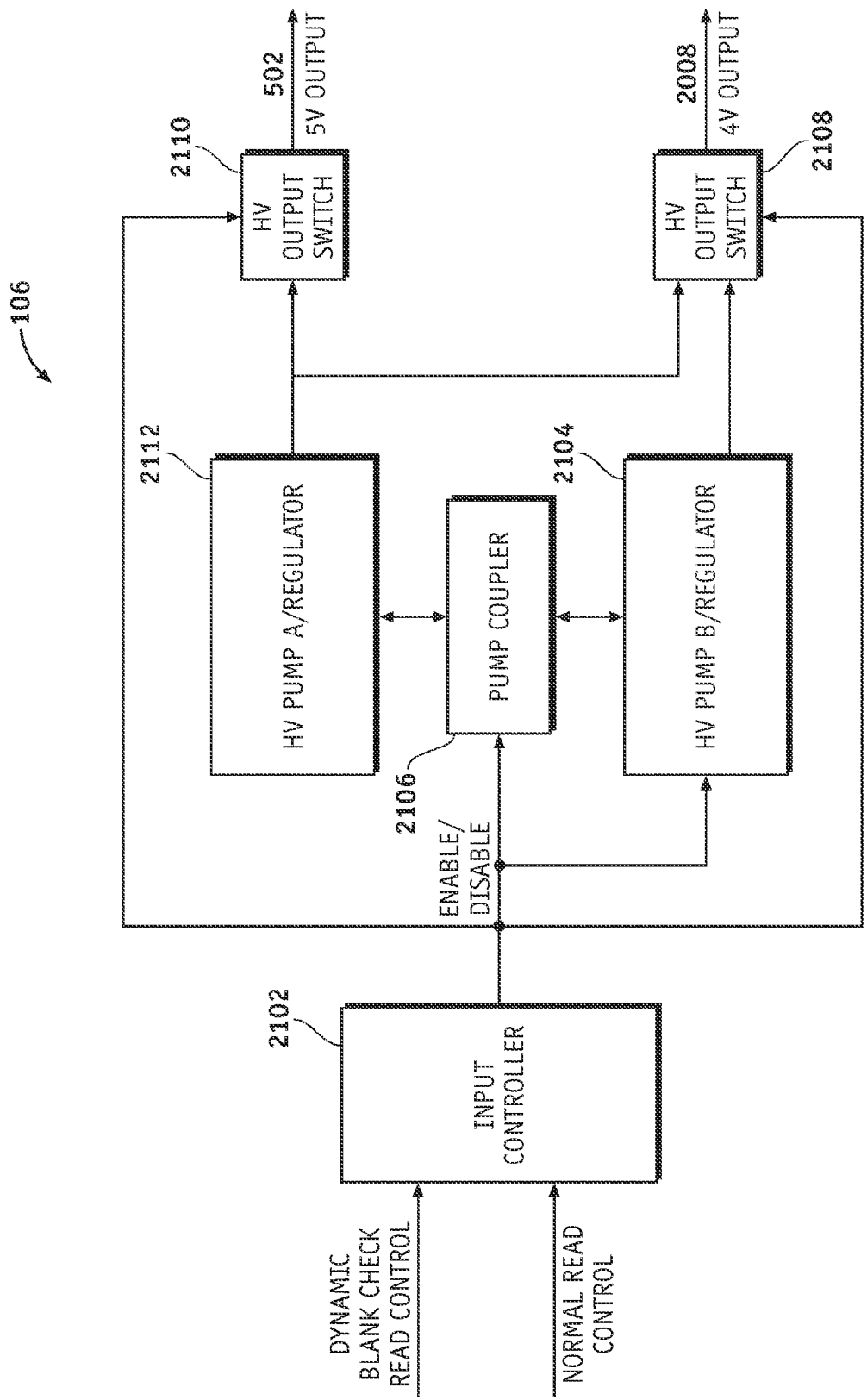
FIG. 21 is a block diagram of a high voltage circuit block for a read operation in accordance with the fourth embodiment of the present invention.

FIG. 21 depicts a high voltage generator 106 which reduces power consumption and time for read operations in accordance with the fourth embodiment of the present invention. A dynamic blank check read control signal and a normal read control signal are provided to an input controller 2102 by the control logic 104 (FIG. 1). The input controller 2102, in response thereto, generates an enable/disable signal which is provided to a first high voltage drain pump and voltage regulator 2104, a drain pump coupler 2106, a first high voltage switch 2108 and a second high voltage switch 2110. The first high voltage drain pump and voltage regulator 2104 provides a high voltage signal at a first voltage level to the first high voltage switch 2108 and a second high voltage drain pump and voltage regulator 2112 provides a high voltage signal at a second high voltage level higher than the first high voltage level to both the first high voltage switch 2108 and the second high voltage switch 2110. The output of the first high voltage switch is provided to the static reference cell word line 2010 while the output of the second high voltage switch is provided to the memory cell and dynamic reference cell word line 502. The pump coupler 2106 is coupled to both the first high voltage drain pump and voltage regulator 2104 and the second high voltage drain pump and voltage regulator 2112. Preferably the first high voltage level is four volts and the second high voltage level is five volts.

Referring to FIG. 22, for the control logic 106 to determine whether the dynamic reference cells 2002 are blank with respect to the static reference cells 2004, the control logic 106 provides the dynamic blank check read control signal to the input controller 2102. To save power by providing non-identically regulated high voltage levels to the dynamic reference cells 2002 and the static reference cells 2004, the input controller 2102 switches the dynamic reference cell blank check enable signal 2202 high at time 2204. A high dynamic reference cell blank check enable signal 2202 enables the first high voltage drain pump and voltage regulator 2104 to generate a voltage signal of four volts. The high dynamic reference cell blank check enable signal 2202 also switches the first high voltage switch 2108 from outputting a voltage signal 2206 having no voltage level to outputting a voltage signal 2206 having a four volt level from the first high voltage drain pump and voltage regulator 2104 (see time 2208) or switches the first high voltage switch 2108 from outputting a voltage signal 2206 having a five volt level from the second high voltage drain pump and voltage regulator 2112 to outputting a voltage signal 2206 having a four volt level from the first high voltage drain pump and voltage regulator 2112 (see time 2210). It is not necessary that the first and second high voltage drain pump and voltage regulators 2104, 2112 be identically regulated, so the pump coupler 2106 is disabled when the dynamic reference cell blank check enable signal 2202 is high. The dynamic blank check read control switching high also enables the second high voltage switch 2110 to provide a voltage signal 2212 of five volts from the second high voltage drain pump and voltage regulator 2112 to the dynamic reference cell word line 502.

When the control logic 106 provides the normal read control signal to the input controller 2102, the input controller 2102 switches the dynamic reference cell blank check enable signal 2202 low and the normal cell read enable signal 2214 high (e.g., at times 2216 and 2218). A low dynamic reference cell blank check enable signal 2202 disables the first high voltage drain pump and voltage regulator 2104. The high normal cell read enable signal 2214 switches the first high voltage switch 2108 from outputting a voltage signal 2206 having a four volt level from the first high voltage drain pump and voltage regulator 2104 to outputting a voltage signal 2206 having a five volt level from the second high voltage drain pump and voltage regulator 2112 (see times 2216, 2218). The normal cell read enable signal 2214 switching high also enables the second high voltage switch 2110 to provide a voltage signal 2212 of five volts from the second high voltage drain pump and voltage regulator 2112 to the dynamic reference cell word line 502. As the output signals from the first and second high voltage switches 2108, 2110 are both provided from the second high voltage drain pump and voltage regulator 2112, they are identically regulated.

While at least one exemplary embodiment has been presented in the foregoing detailed description of the invention, it should be appreciated that a vast number of variations exist. In addition, any combination of the four embodiments of the present invention are possible, providing combined power and time savings. It should also be appreciated that the exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the claims. Accordingly, the scope of the present invention is only limited by the claims hereinbelow and their equivalents.

What is claimed is:

1. A method for high voltage programming on selected memory cells of a semiconductor memory device comprising a memory cell array comprising a plurality of memory cells including the selected memory cells, each of said plurality of memory cells accessed by one of a plurality of word lines and one of a plurality of bit lines, the method comprising the steps of:

providing a high voltage level to a first portion of the plurality of bit lines for a predetermined time interval to program a first portion of the selected memory cells;

precharging a second portion of the plurality of bit lines during the predetermined time interval that the high voltage level is provided to the first portion of the plurality of bit lines; and thereafter providing the high voltage level to the second portion of the plurality of bit lines for the predetermined time interval to program the second portion of the selected memory cells.

2. The method of claim 1 further comprising the step of discharging the first portion of the plurality of bit lines during the predetermined time interval that the high voltage level is provided to the second portion of the plurality of bit lines.

3. The method of claim 1 further comprising the step of providing a continuous high voltage level on selected ones of the plurality of word lines to the selected memory cells for the predetermined time interval to program the first and the second portions of the selected memory cells.

4. The method of claim 1 wherein the step of precharging the second portion of the plurality of bit lines comprises the step of precharging the second portion of the plurality of bit lines to a voltage level less than the high voltage level.

5. The method of claim 4 wherein the step of providing the high voltage level to the second portion of the plurality of bit lines comprises the step of, during the predetermined time interval, further charging the second portion of the plurality of bit lines from the voltage level less than the high voltage level to the high voltage level and thereafter providing the high voltage level to the second portion of the plurality of bit lines.

6. The method of claim 1 wherein the semiconductor memory device comprises a bit line decoder comprising a plurality of data block decoders, each of the plurality of data block decoders coupled to a corresponding one of the plurality of bit lines, and wherein the step of providing the high voltage level to the first portion of the plurality of bit lines for the predetermined time interval comprises the step of providing the high voltage level to a portion of the plurality of data block decoders performing substantially equivalent decoding of the corresponding ones of the plurality of bit lines.

7. A semiconductor memory device comprising:

a memory cell array comprising a plurality of memory cells including selected memory cells for performing high voltage operations thereon;

a plurality of word lines, each of the plurality of word lines coupled to one or more of the plurality of memory cells for access thereof;

a plurality of bit lines, each of the plurality of bit lines coupled to one or more of the plurality of memory cells for access thereof;

a high voltage generator coupled to the plurality of word lines and the plurality of bit lines for generating a high voltage level to the plurality of word lines and the plurality of bit lines; and a bit line decoder coupled to the high voltage generator and the plurality of bit lines for controlling the provision of high voltage to selected ones of the plurality of bit lines for high voltage operation of selected memory cells, the bit line decoder providing a high voltage level to a first portion of the plurality of bit lines for a predetermined time interval to program a first portion of the selected memory cells, precharging a second portion of the plurality of bit lines during the predetermined time interval that the high voltage level is provided to the first portion of the plurality of bit lines, and thereafter providing the high voltage level to the second portion of the plurality of bit lines for the predetermined time interval to program a second portion of the selected memory cells.

8. The semiconductor memory device of claim 7 wherein the bit line decoder further discharges the first portion of the plurality of bit lines during the predetermined time interval that the high voltage level is provided to the second portion of the plurality of bit lines.

9. The semiconductor memory device of claim 7 further comprising a word line decoder coupled to the high voltage generator and providing a continuous high voltage level on selected ones of the plurality of word lines to the selected memory cells for the predetermined time interval to program the first and the second portions of the selected memory cells.

10. The semiconductor memory device of claim 7 wherein the bit line decoder precharges the second portion of the plurality of bit lines to a voltage level less than the high voltage level.

11. The semiconductor memory device of claim 10 wherein the bit line decoder, during the predetermined time interval, further charges the second portion of the plurality of bit lines from the voltage level less than the high voltage level to the high voltage level and thereafter provides the high voltage level to the second portion of the plurality of bit lines.

12. The semiconductor memory device of claim 7 wherein the bit line decoder comprises a plurality of data block decoders, each of the plurality of data block decoders coupled to a corresponding one of the plurality of bit lines, and wherein the step of providing the high voltage level to the first portion of the plurality of bit lines for the predetermined time interval comprises the step of providing the high voltage level to a portion of the plurality of data block decoders performing substantially equivalent decoding of the corresponding ones of the plurality of bit lines.

* * * * *